(12) United States Patent
Watanabe

(10) Patent No.: US 12,436,468 B2
(45) Date of Patent: Oct. 7, 2025

(54) EXPOSURE APPARATUS, EXPOSURE METHOD, DEVICE MANUFACTURING METHOD, AND DEVICE

(71) Applicant: NIKON CORPORATION, Tokyo (JP)

(72) Inventor: Yoji Watanabe, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 180 days.

(21) Appl. No.: 18/286,275

(22) PCT Filed: Mar. 17, 2022

(86) PCT No.: PCT/JP2022/012296
§ 371 (c)(1),
(2) Date: Oct. 10, 2023

(87) PCT Pub. No.: WO2022/220010
PCT Pub. Date: Oct. 20, 2022

(65) Prior Publication Data
US 2024/0184214 A1 Jun. 6, 2024

(30) Foreign Application Priority Data

Apr. 12, 2021 (JP) ................. 2021-067085

(51) Int. Cl.
*G03F 7/00* (2006.01)
*G03F 9/00* (2006.01)
(52) U.S. Cl.
CPC ...... *G03F 7/70508* (2013.01); *G03F 7/70775* (2013.01); *G03F 9/7088* (2013.01)
(58) Field of Classification Search
CPC ............ G03F 7/70358; G03F 7/70425; G03F 7/70508; G03F 7/70775; G03F 7/70291;
(Continued)

(56) References Cited

U.S. PATENT DOCUMENTS 5,859,707 A 1/1999 Nakagawa et al.
8,089,616 B2 1/2012 Owa
(Continued)

FOREIGN PATENT DOCUMENTS

| JP | H09-219354 A | 8/1997 | |
| JP | 2013-058520 A | 3/2013 | |
| JP | 2017215483 A | * 12/2017 | ............... G03F 7/20 |

OTHER PUBLICATIONS

May 24, 2022 Written Opinion issued in International Patent Application No. PCT/JP2022/012296.
(Continued)

*Primary Examiner* — Peter B Kim
(74) *Attorney, Agent, or Firm* — Oliff PLC

(57) ABSTRACT

An exposure apparatus includes: a substrate stage onto which a substrate is to be mounted; an exposure unit radiating an exposure light toward the draw-out electrode on at least one semiconductor chip; a pattern determination unit determining an exposure pattern; and a controller controlling the substrate stage and the exposure unit. The pattern determination unit determines a pattern of a relay wiring connecting the draw-out electrode and a predetermined position with respect to the substrate, by using an output from a measurement unit to measure a position of the semiconductor chips on the substrate to obtain a positional deviation. The controller exposes the relay wiring pattern onto an exposure area extending, on the photosensitive layer, in the uniaxial direction by the exposure unit, while moving the substrate from a first-side in the uniaxial direction to a second-side opposite to the first-side in the uniaxial direction by the substrate stage.

29 Claims, 19 Drawing Sheets

(58) Field of Classification Search
CPC ... G03F 9/7088; G03F 9/7073; H01L 23/544; H01L 24/19; H01L 24/20; H01L 2223/54426; H01L 2224/19; H01L 2224/211; H01L 2224/221
See application file for complete search history.

(56) References Cited

U.S. PATENT DOCUMENTS

| | | |
|---|---|---|
| 8,799,845 B2 | 8/2014 | Scanlan et al. |
| 10,684,562 B2 | 6/2020 | Shibazaki |
| 10,698,326 B2 | 6/2020 | Shibazaki |
| 10,775,708 B2 | 9/2020 | Shibazaki |
| 10,777,441 B2 | 9/2020 | Ichinose et al. |
| 2014/0007033 A1* | 1/2014 | Kitamura ............. G06F 30/398 716/112 |
| 2019/0257647 A1 | 8/2019 | Chinose et al. |
| 2020/0257205 A1 | 8/2020 | Yashiki |
| 2023/0400773 A1* | 12/2023 | Kato .................. G03F 7/70291 |

OTHER PUBLICATIONS

May 24, 2022 International Search Report issued in International Patent Application No. PCT/JP2022/012296.

Jun. 24, 2025 Extended Search Report issued in European Patent Application No. 22787936.8.

* cited by examiner

FIG. 3
(a)
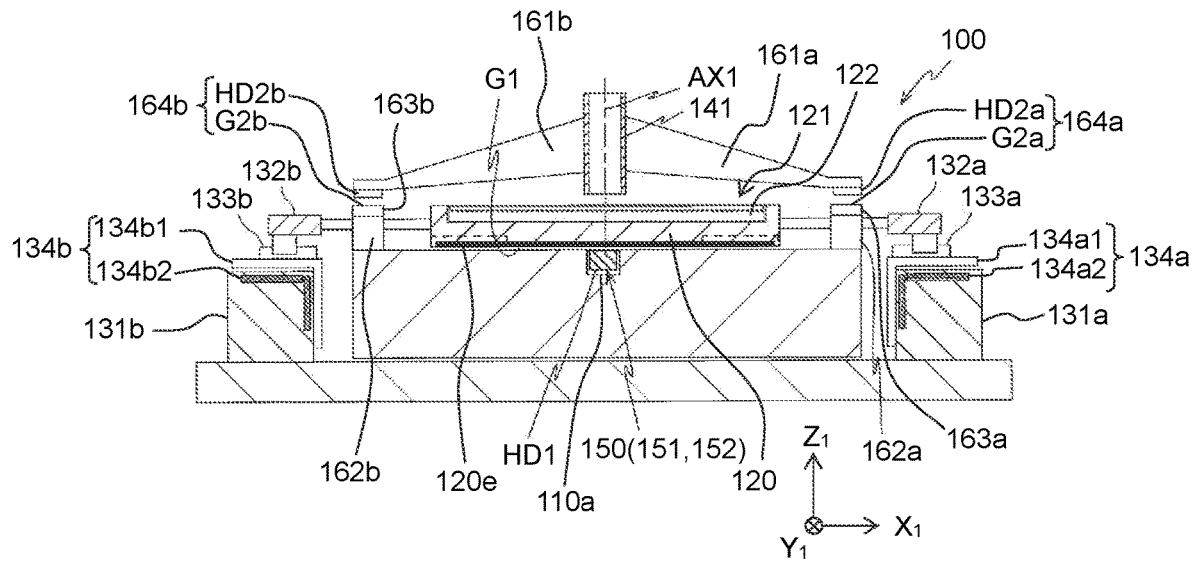
(b)
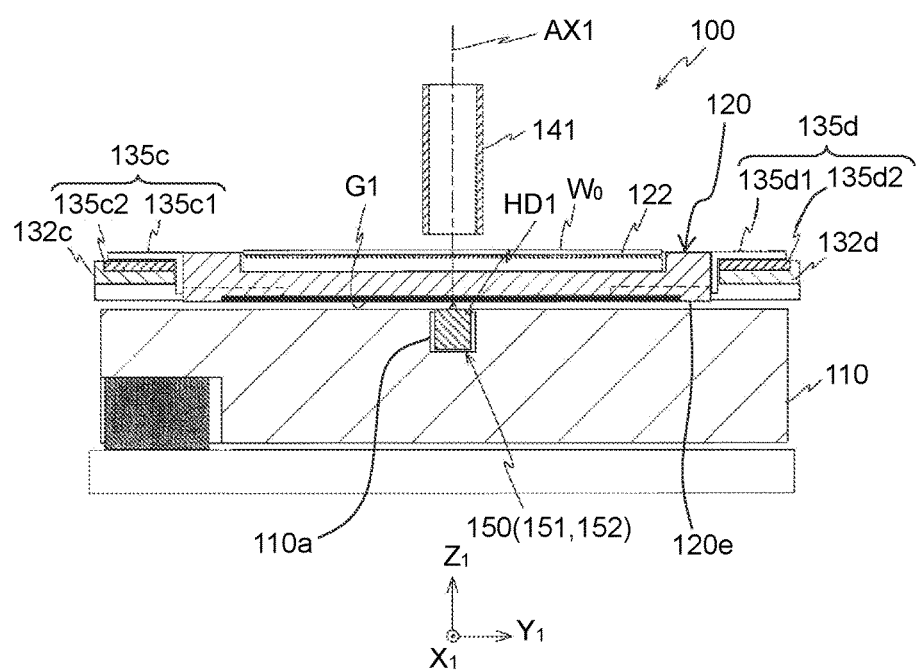

FIG. 21
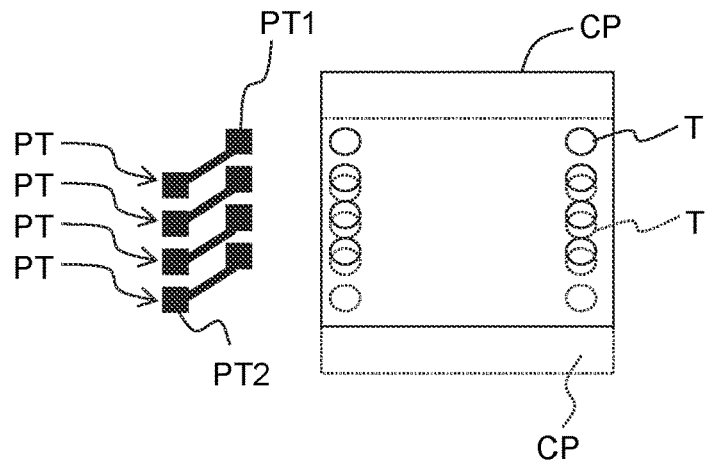
FIG. 22
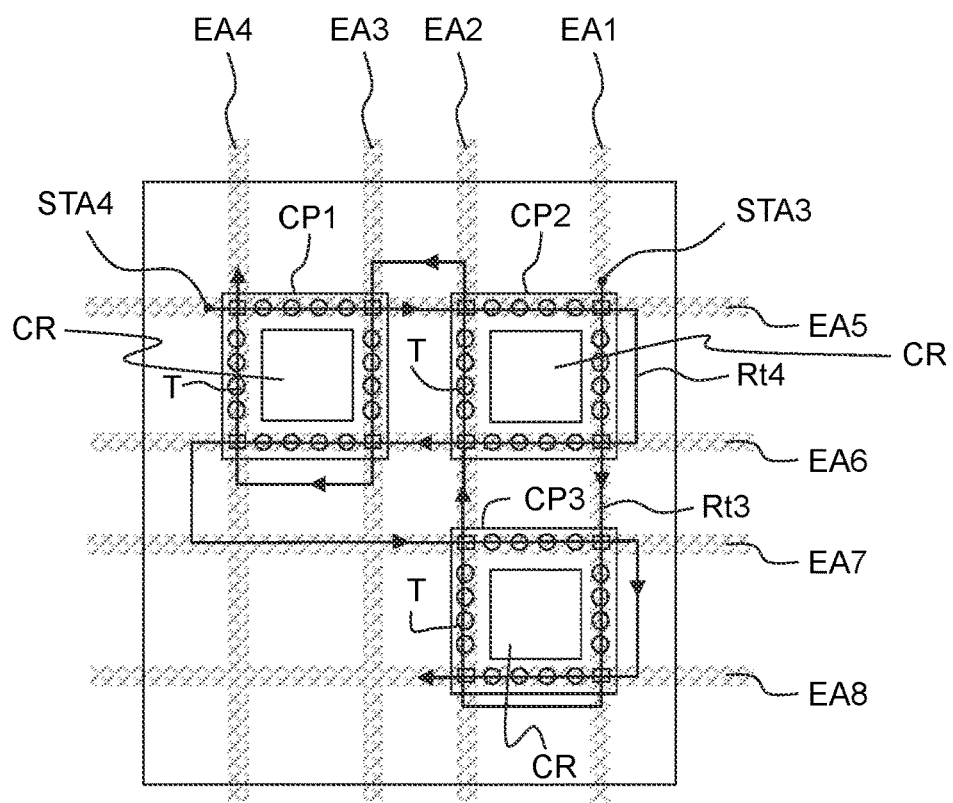
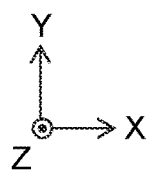

EXPOSURE APPARATUS, EXPOSURE METHOD, DEVICE MANUFACTURING METHOD, AND DEVICE

TECHNICAL FIELD

The present invention relates to an exposure apparatus, an exposure method, a device manufacturing method, and a device.

BACKGROUND

In the manufacture of semiconductor devices, wafer-level packaging technology in which packaging of semiconductor chip(s) is performed on a wafer is used. Regarding the wafer-level packaging technology, it is known that it is required to deal with a positional deviation of semiconductor chip(s) with respect to the wafer (Patent Literature 1).

CITATION LIST

Patent Literature

Patent Literature 1: U.S. Pat. No. 8,799,845, specification.

SUMMARY

According to a first aspect, there is provided an exposure apparatus for exposing a photosensitive layer formed as an upper layer of a draw-out electrode provided on a plurality of semiconductor chips arranged on a substrate, the exposure apparatus including:
a substrate stage onto which the substrate is to be mounted, the plurality of semiconductor chips being arranged on the substrate along a uniaxial direction;
an exposure unit configured to radiate an exposure light toward the draw-out electrode provided in an electrode formation area extending, on at least one of the plurality of semiconductor chips, along the uniaxial direction;
a pattern determination unit configured to determine an exposure pattern to be exposed onto the photosensitive layer by the exposure unit; and
a controller configured to control at least the substrate stage and the exposure unit, wherein:
the pattern determination unit is configured to determine, as the exposure pattern, a pattern of a relay wiring connecting the draw-out electrode and a predetermined position with respect to the substrate, by using an output from a measurement unit configured to measure a position of the plurality of semiconductor chips provided on the substrate so as to obtain a positional deviation of the plurality of semiconductor chips; and
the controller is configured to expose the pattern of the relay wiring onto an exposure area extending, on the photosensitive layer, in the uniaxial direction by the exposure unit, while moving the substrate from a first-side in the uniaxial direction to a second-side opposite to the first-side in the uniaxial direction by the substrate stage.

According to a second aspect, there is provided an exposure method for exposing a photosensitive layer formed as an upper layer of a draw-out electrode provided on a plurality of semiconductor chips arranged on a substrate along a uniaxial direction, the method including:

obtaining a positional deviation of the plurality of semiconductor chips by measuring a position of the plurality of semiconductor chips provided on the substrate;
radiating an exposure light toward the draw-out electrode provided in an electrode formation area extending along the uniaxial direction on the plurality of semiconductor chips;
determining, as the exposure pattern, a pattern of a relay wiring connecting the draw-out electrode and a predetermined position with respect to the substrate by using the obtained positional deviation of the plurality of semiconductor chips; and
exposing the pattern of the relay wiring onto an exposure area extending in the uniaxial direction on the photosensitive layer while moving the substrate from a first-side in the uniaxial direction to a second-side opposite to the first-side in the uniaxial direction.

According to a third aspect, there is provided a device manufacturing method for manufacturing a device including a plurality of semiconductor chips having a draw-out electrode, a relay wiring having a first-end electrically connected to the draw-out electrode, and an output wiring electrically connected to a second-end, opposite to the first-end, of the relay wiring, the method including:
forming a photosensitive layer on the plurality of semiconductor chips;
exposing a pattern of the relay wiring onto the photosensitive layer by using the exposure method of the second aspect;
forming a pattern of the photosensitive layer by developing the photosensitive layer to which the exposing of the pattern of the relay wiring has been performed; and
forming the relay wiring by using the formed pattern of the photosensitive layer.

According to a fourth aspect, there is provided a device including:
a substrate;
a plurality of semiconductor chips provided on the substrate;
the relay wiring layer formed on the plurality of semiconductor chips by using the device manufacturing method of the third aspect; and
the pattern of the output wiring formed on the relay wiring layer.

BRIEF DESCRIPTION OF DRAWINGS

FIGS. 3(a) and 3(b) FIG. 3(a) is a cross-sectional view of a main part of the measurement section by a plane including an optical axis of a mark detection system and orthogonal to $Y_1$ direction. FIG. 3(b) is a cross-sectional view of the main part of the measurement section by a plane including the optical axis of the mark detection system and orthogonal to $X_1$ direction.

FIG. 9(b) is a cross-sectional view taken along a B-B line in FIG. 9(a).

FIG. 10(b) is a top view of a first insulating layer of the device of FIG. 9(a). FIG. 10(c) is a top view of a second insulating layer and a relay-wiring layer of the device of FIG. 9(a). FIG. 10(d) is a top view of a third insulating layer of the device of FIG. 9(a). FIG. 10(e) is a top view of a fourth insulating layer and a re-wiring layer of the device of FIG. 9(a). FIG. 10(f) is a top view of a fifth insulating layer and an electrode layer of the device of FIG. 9(a).

FIG. 13(b) is a plan view depicting one of sections on the wafer. In FIG. 13(b), three semiconductor chips are arranged at their designed positions in one of the sections on the wafer. FIG. 13(c) is a cross-sectional view taken along C-C line in FIG. 13(b).

FIG. 20(b) is a schematic view depicting one example of a fine adjustment pattern stored in a fine adjustment table according to a modification.

FIG. 21 is a plan view of a portion of one section on a wafer. Semiconductor chips deviated from designed positions linearly in an electrode arrangement direction and relay wiring patterns of the modification corresponding to those semiconductor chips are depicted in FIG. 21.

FIG. 22 is a plan view of one section on a wafer. An aspect of a movement of a projection area with respect to a semiconductor chip in a case that a pattern of a relay wiring is exposed by a pattern exposure section in a relay wiring formation step of a modification is depicted in FIG. 22.

DESCRIPTION OF EMBODIMENTS

Embodiment

An exposure system ES and a device manufacturing method using the exposure system ES, of an embodiment of the present invention, are explained with reference to FIGS. 1 to 19.

[Exposure System ES]

Figure 1:
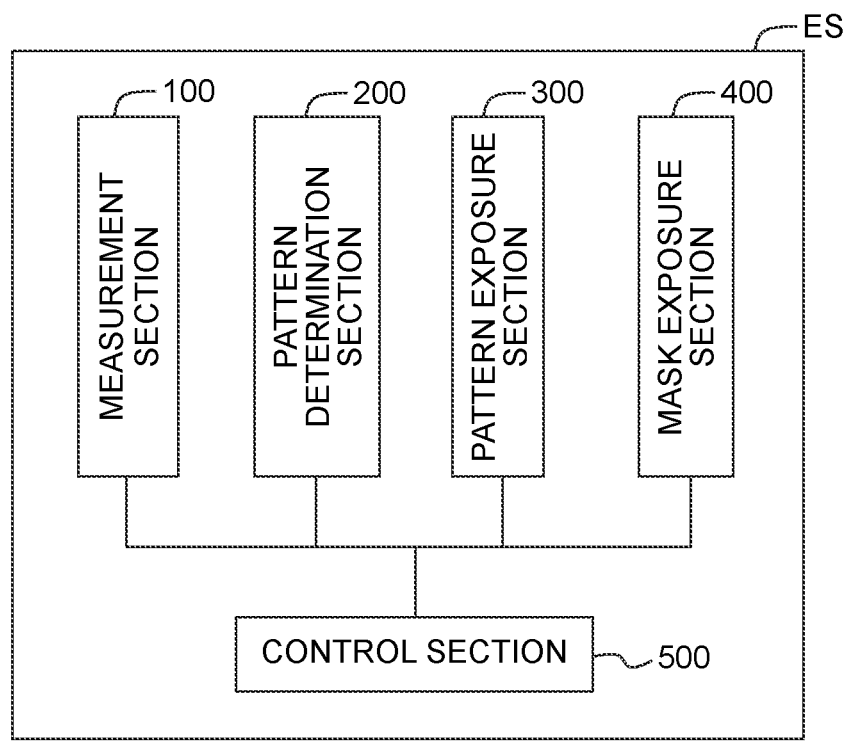
FIG. 1 is a block diagram depicting a configuration of an exposure system according to an embodiment of the present invention.

As depicted in FIG. 1, the exposure system ES of the embodiment mainly includes a measurement section (measurement unit, first measurement section) 100, a pattern determination section (pattern determination unit) 200, a pattern exposure section (pattern exposure unit) 300, a mask exposure section (mark exposure unit) 400, and a control section (control unit, controller) 500.

The configuration of each of the measurement section 100, the pattern determination section 200, the pattern exposure section 300, and the mask exposure section 400 will be described using the case where an object to be processed is a wafer $W_0$ as an example. The control section 500 controls the overall operation of the exposure system ES.

[Measurement Section 100]

The measurement section 100 performs alignment measurement of the wafer $W_0$.

Figure 2:
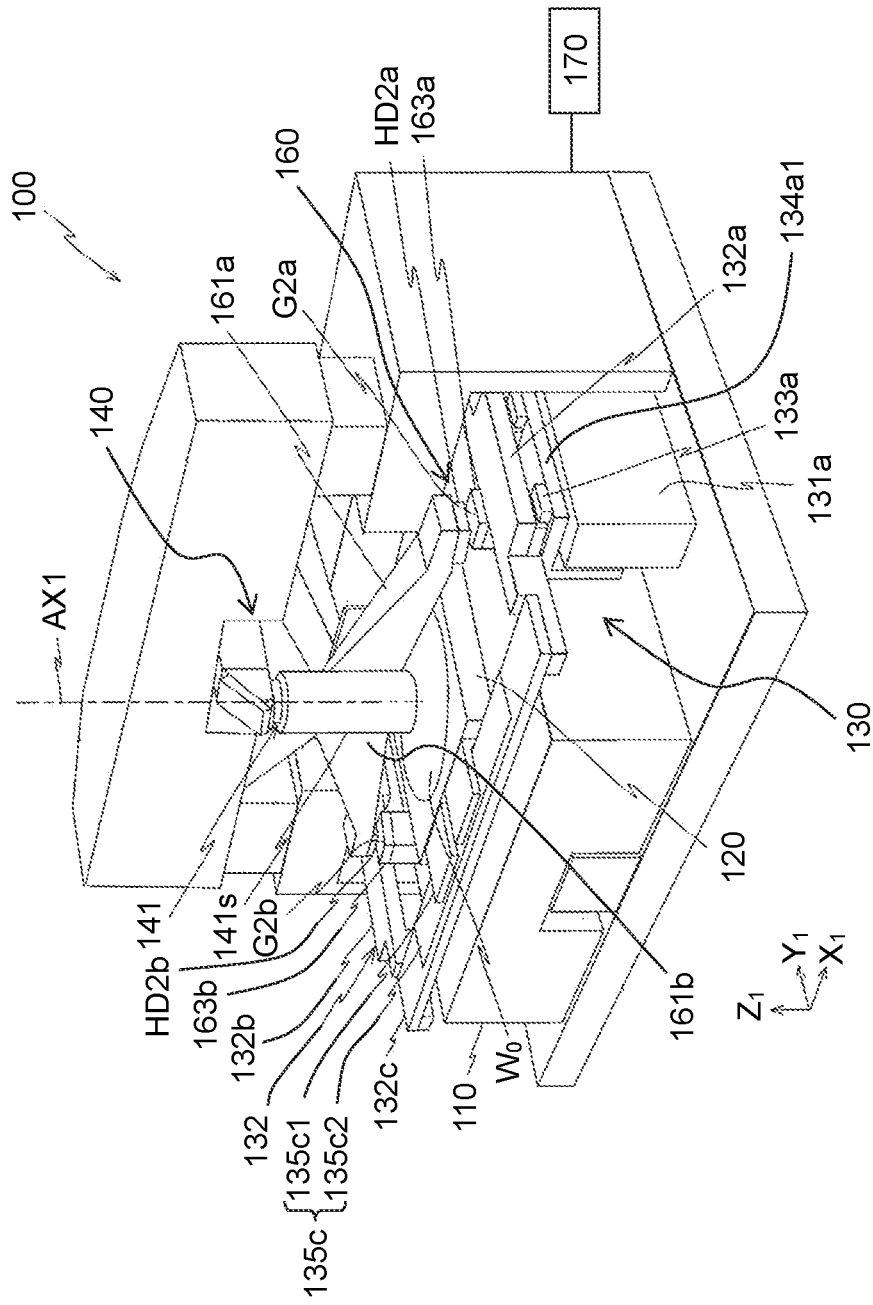
FIG. 2 is a perspective view of a measurement section.

As depicted in FIG. 2, FIG. 3(a), and FIG. 3(b), the measurement section 100 mainly includes a surface table 110, a slider 120, a drive system 130, a measurement unit 140, a first position measurement system 150 (FIG. 3(a)), a second position measurement system 160, and a measurement control unit 170. In the explanation of the measurement section 100, two directions orthogonal to each other in the horizontal plane are defined as $X_1$ direction and $Y_1$ direction, and the vertical direction is defined as $Z_1$ direction.

The surface table 110 is a cuboid member being a rectangular in a plan view. The top surface of the surface table 110 is a flat surface with a high degree of flatness and functions as a guide surface to guide a movement of the slider 120.

The slider 120 moves in the horizontal plane while supporting the wafer $W_0$. The slider 120 is slidably arranged on the top surface of the surface table 110. The slider 120 has a plate shape being rectangular in a plan view. A recess 121 being circular in a plan view is provided at the center part of the top surface of the slider 120 (FIG. 3(a), FIG. 3(b)). A wafer holder 122 is provided in the recess 121.

The drive system 130 moves the slider 120 in the $X_1$ direction and the $Y_1$ direction. The drive system 130 mainly includes a pair of linear guides 131a, 131b and a movable stage 132.

Each of the pair of linear guides 131a, 131b is a cuboid base. One of the pair of linear guides 131a, 131b is arranged at one side in the $X_1$ direction of the surface table 110, and the other of the pair of linear guides 131a, 131b is arranged at the other side in the $X_1$ direction of the surface table 110.

Each of the pair of linear guides 131a, 131b is rectangular in a plan view, and their long side directions match with the $Y_1$ direction.

The movable stage 132 has a first plate member 132a and a second plate member 132b arranged on both sides of the slider 120 in the $X_1$ direction, and a third plate member 132c and a fourth plate member 132d arranged on both sides of the slider 120 in the $Y_1$ direction. The first plate member 132a to the fourth plate member 132d are connected to each other to form a frame shape surrounding the slider 120.

A mover 134a1 is fixed to the lower surface of the first plate member 132a via a connection member 133a. The mover 134a1 constitutes a Y-axis linear motor 134a together with a stator 134a2 provided near the top surface of the linear guide 131a. Similarly, a mover 134b1 is fixed to the lower surface of the second plate member 132b via a connection member 133b. The mover 134b1 constitutes a Y-axis linear motor 134b together with a stator 134b2 provided near the top surface of the linear guide 131b. The movers 134a1 and 134b1 are slightly raised from the stators 134a2 and 134b2 by an un-depicted air bearing.

A stator 135c2 is provided on the top surface of the third plate member 132c. The stator 135c2 constitutes an XY linear motor 135c together with a mover 135c1 fixed to the slider 120. Similarly, a stator 135d2 is provided on the top surface of the fourth plate member 132d. The stator 135d2 constitutes a XY linear motor 135d together with a mover 135d1 fixed to the slider 120. The movers 135c1 and 135d1 are slightly raised from the stators 135c2 and 135d2 by an un-depicted air bearing.

The movable stage 132 is moved in the $Y_1$ direction with respect to the pair of linear guides 131a, 131b by the Y-axis linear motors 134a, 134b. The slider 120 is moved in the $X_1$ direction and moved finely in the $Y_1$ direction with respect to the movable stage 132 by the XY-linear motors 135c, 135d.

The measurement unit 140 optically detects a mark (an alignment mark as an example) provided on a measurement object on the slider 120. The measurement unit 140 mainly includes a mark detection system 141.

As an example, a field image alignment (FIA) system being a type of an image-forming alignment sensor of image processing system may be used as the mark detection system 141. The image-forming alignment sensor of image processing system is configured to measure a position of a mark by illuminating the mark with a broadband light such as a halogen lamp and then processing an image of the mark. Other than the image-forming alignment sensor of image processing system, any alignment detection system, such as diffracted light interference type, beam scanning type, etc., may be used as the mark detection system 141. The mark detection system 141 includes a lens barrel 141s and an optical system (not depicted) with an optical axis AX1 inside the lens barrel 141s, and emits a detection light to a measurement object on the slider 120. The mark detection system 141 may have an alignment autofocus function to adjust a focus position of the optical system.

The first position measurement system 150 is composed mainly of a head HD1, a lower surface 120e of the slider 120, and a grating G1 provided on the lower surface 120e.

The head HD1 is arranged inside a recess 110a provided at the center part of the top surface of the surface plate 110.

The grating G1 includes a reflective diffraction grating with the periodic direction in the $X_1$ direction (X diffraction grating) and a reflective diffraction grating with the periodic direction in the $Y_1$ direction (Y diffraction grating). The pitches of the X diffraction grating and Y diffraction grating may be 1 μm as an example.

The head HD1 is configured to irradiate the grating G1 with a plurality of beams, and receive diffracted beams from the grating G1. The head HD1 and the grating G1 compose the encoder system 151. The encoder system 151 measures a position in the $X_1$ direction of the slider 120 and a position in the $Y_1$ direction of the slider 120.

The head HD1 is also configured to irradiate the lower surface 120e of the slider 120 with four length-measuring beams and receive the return beams from the lower surface 120e. The head HD1 and the lower surface 120e of the slider 120 compose a laser interferometer system 152. The laser interferometer system 152 measures a position in each of the $Z_1$ direction, the $\theta X_1$ direction, and the $\theta Y_1$ direction of the slider 120.

The second position measurement system 160 is composed mainly of heads HD2a, HD2b and gratings G2a, G2b.

The head HD2a is provided at the tip of a head attachment member 161a extending from the lens barrel 141s of the mark detection system 141 to one side in the $X_1$ direction. The head HD2b is provided at the tip of a head attachment member 161b extending from the lens barrel 141s of the mark detection system 141 to the other side in the $X_1$ direction.

The gratings G2a, G2b are provided on the upper surfaces of scale members 163a, 163b fixed to the surface plate 110 via support members 162a, 162b, respectively. The gratings G2a, G2b are each a two-dimensional grating of reflective type and are facing the heads HD2a, HD2b, respectively.

The head HD2a and the grating G2a compose the encoder system 164a, and the head HD2b and the grating G2b compose the encoder system 164b. The encoder systems 164a, 164b measure the position in each of $X_1$ direction, $Y_1$ direction, $Z_1$ direction, $\theta X_1$ direction, $\theta Y_1$ direction, and $\theta Z_1$ direction of the surface plate 110 with respect to the mark detection system 141.

The measurement control unit 170 is configured to control the drive system 130, the measurement unit 140, the first position measurement system 150, and the second position measurement system 160 as a whole to perform alignment measurement for the wafer $W_0$.

As the measurement unit 100 having the above configuration, the measurement devices disclosed in U.S. Patent Application Publication No. 2019/257,647, the specification of U.S. Pat. No. 10,684,562, the specification of U.S. Pat. No. 10,698,326, the specification of U.S. Pat. No. 10,775,708, or the specification of U.S. Pat. No. 10,777,441 may be used.

[Pattern Determination Section 200]

The pattern determination section 200 is configured to determine an exposure pattern of an exposure performed by the pattern exposure section 300 with respect to a photosensitive layer of the wafer $W_0$, based on the result of the alignment measurement performed by the measurement section 100.

Figure 4:
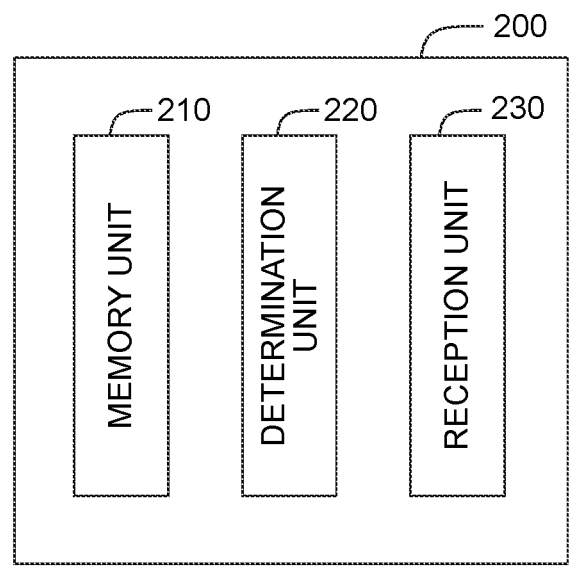
FIG. 4 is a block diagram depicting a configuration of a pattern determination section.

As depicted in FIG. 4, the pattern determination section 200 mainly includes a memory unit 210, a determination unit 220, and a reception unit 230.

The memory unit 210 is configured to store a table used to determine the pattern. The determination unit 220 is configured to determine the pattern based on the table and the measurement result of the measurement section 100. Reception unit 230 is configured to receive an output from the measurement section 100 and send the received output to the determination unit 220.

Details of the pattern determination section 200 will be described below.

[Pattern Exposure Section 300]

The pattern exposure section 300 is configured to expose the pattern determined by the pattern determination section 200 on the photosensitive layer of the wafer $W_0$.

Figure 5:
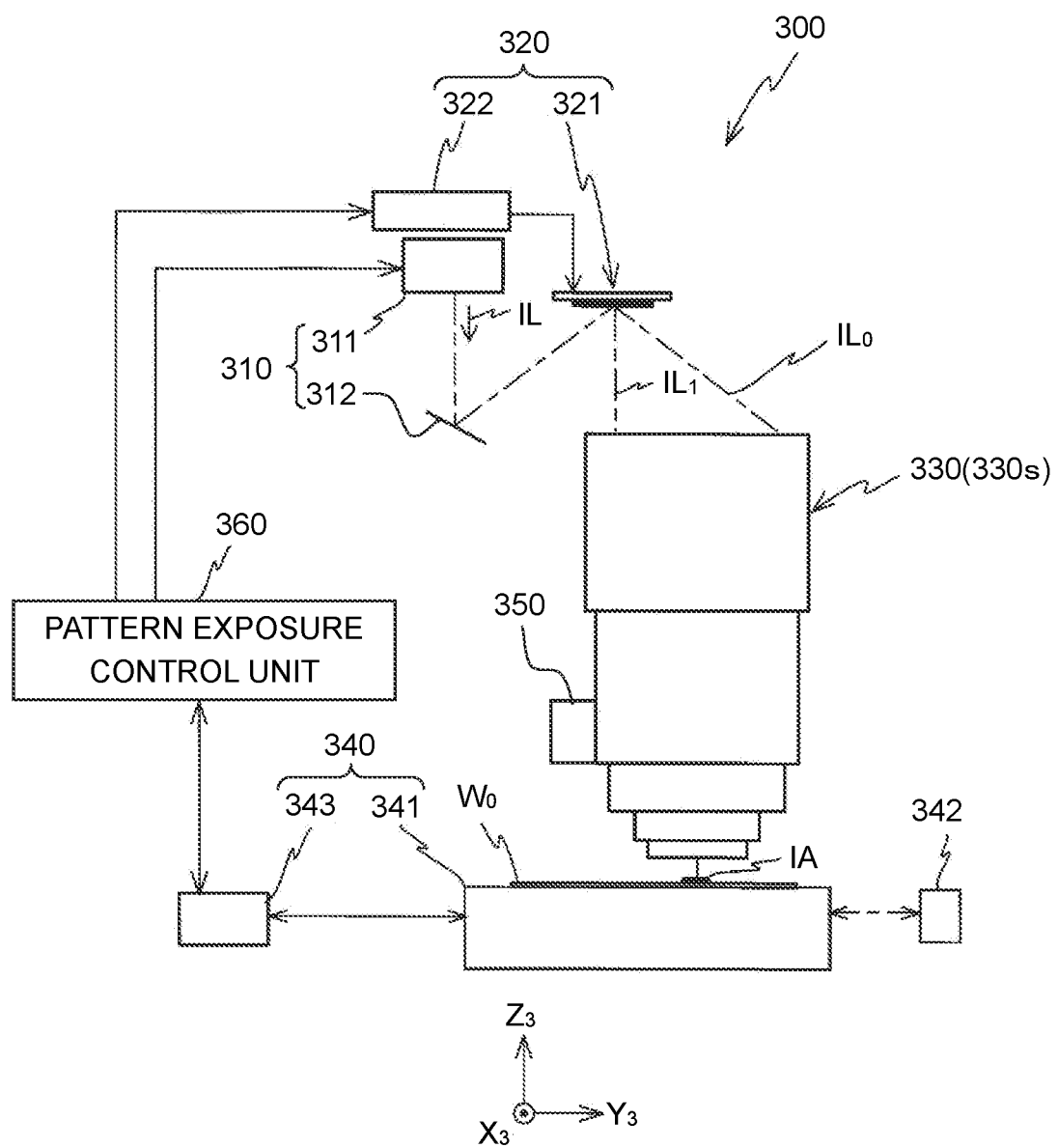
FIG. 5 is a schematic view depicting an overall configuration of a pattern exposure section.

As depicted in FIG. 5, the pattern exposure section 300 mainly includes an illumination system 310, a pattern generation device 320, a projection optical system 330, a stage device 340, an alignment detection system (second measurement unit) 350, and a pattern exposure control unit 360. In the description of the pattern exposure section 300, the two directions orthogonal to each other in the horizontal plane are $X_3$ direction and $Y_3$ direction, and the vertical direction is $Z_3$ direction.

The illumination system 310 mainly includes a light source system (not depicted), an illumination optical system 311, and a reflection mirror 312. The light source system includes, as an example, a solid-state laser source (such as, DFB semiconductor laser, fiber laser, etc.). The illumination optical system 311 includes a forming optical system, an optical integrator, a field stop, and a relay lens system (each not depicted) for changing illumination conditions.

The pattern generation device 320 is an electronic mask system configured to generate a pattern to be projected onto the photosensitive layer of the wafer $W_0$ mounted on a stage 341 (described below) of the stage device 340. The pattern generation device 320 mainly includes a variable forming mask 321 and a mask drive unit 322.

Figure 6:
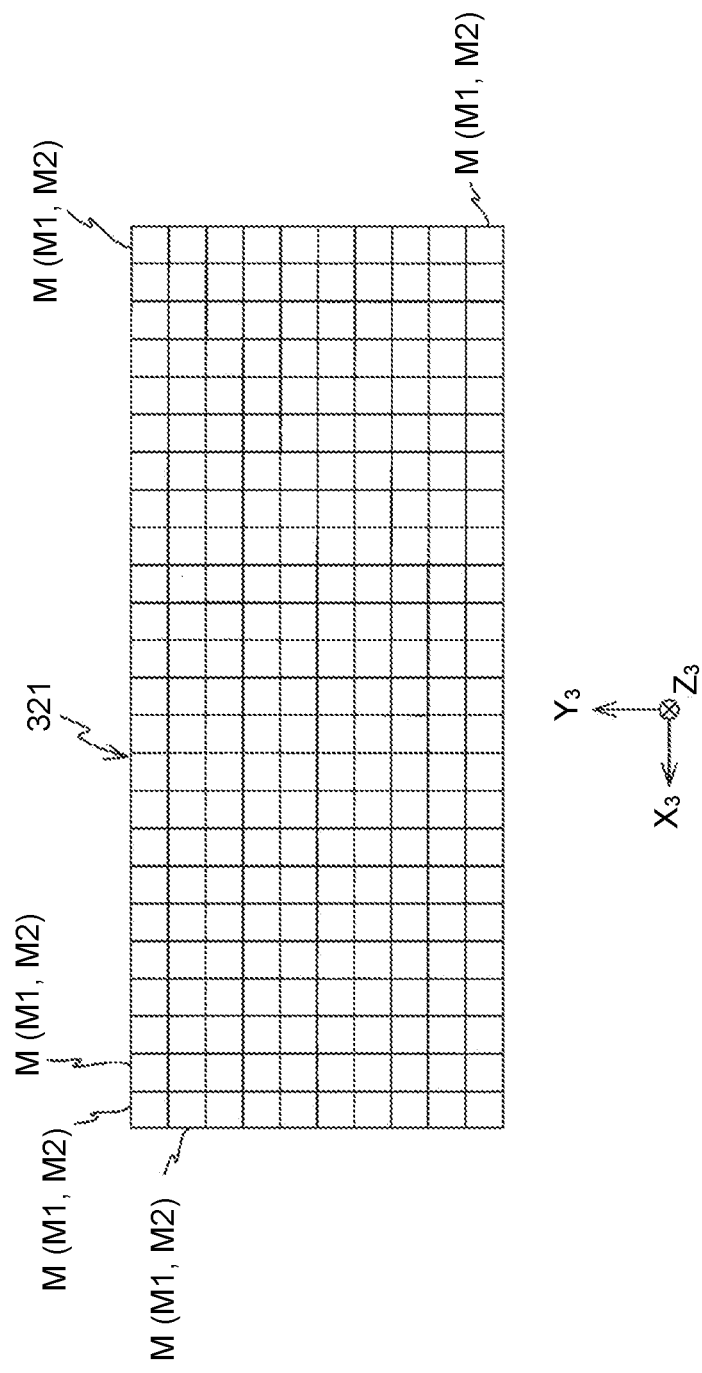
FIG. 6 is a plan view of a variable forming mask of a pattern generation device.

As depicted in FIG. 6, the variable forming mask 321 has a plurality of micromirror mechanisms M arranged in a matrix (two-dimensional, array-like) in the $X_3$-$Y_3$ plane. Each of the micromirror mechanisms M has a micromirror M1, and a drive mechanism M2 provided at a side of the micromirror M1 opposite to a side at which a reflective surface of the micromirror M1 is provided. The drive mechanism M2 rotates the micromirror M1 around an axis extending in the $X_3$ direction.

The mask drive unit 322 drives the drive mechanism M2 of each of the plurality of micromirror mechanisms M in accordance with a control signal from the pattern exposure control unit 360 so as to switch the micromirror M1 between the on state (on position) and the off state (off position).

In a case that the illumination light IL from the illumination system 310 enters the micromirror M1 in the on state, the zeroth-order diffraction light $IL_0$ of the illumination light IL enters the projection optical system 330. On the other hand, in a case that the illumination light IL from the illumination system 310 enters the micromirror M1 in the off state, the zeroth-order diffracted light $IL_0$ of the illumination light IL reaches a non-exposure optical path deviated from the projection optical system 330. The pattern generation device 320 gives a pattern to the illumination light IL by setting each of the plurality of micromirrors M1 to either the on state or the off state.

The projection optical system 330 projects the pattern generated by the pattern generation device 320 onto the wafer $W_0$ arranged on the stage 341 while reducing at a projection magnification β (for example, β=1/200, 1/400, 1/500, etc.). That is, the pattern generated by the pattern generation device 320 is exposed on the wafer $W_0$ by the energy beam travelled via the pattern generation device 320. The projection optical system includes a lens barrel 330s and a plurality of optical elements (not depicted) arranged in the lens barrel 330s in a predetermined positional relationship.

The stage device 340 mainly includes a stage (substrate stage) 341, a laser interferometer 342, and a stage control unit 343.

The stage 341 holds a wafer $W_0$ via a wafer holder (not depicted) provided at the center of the top surface of the stage 341. The stage 341 is movable in the $X_3$ direction, the $Y_3$ direction, and the $Z_3$ direction and is rotatable around an axis extending in the $Z_3$ direction, by an undepicted stage drive system.

The laser interferometer 342 continuously detects the position in each of the $X_3$ direction, the $Y_3$ direction, and the $\theta Z_3$ direction (that is, a direction around the axis extending in the $Z_3$ direction) of the stage 341, by irradiating a reflective surface provided on an end surface of the stage 341 with a length-measuring beam, with a resolution of, for example, 0.5 to 1 nm.

The stage control unit 343 controls the movement of the stage 341 according to a control signal from the pattern exposure control unit 360.

The alignment detection system (measurement unit, second measurement unit) 350 is arranged on the side surface of the projection optical system 330. In the present embodiment, an image-forming alignment sensor configured to detect a street line and/or a position detection mark (substrate alignment mark) formed on the wafer $W_0$ is used as the alignment detection system 350. The detailed configuration of the alignment detection system 350 is disclosed, for example, in Japanese Patent Application Laid Open No. H9-219354. The detection result of the alignment detection system 350 is supplied to the pattern exposure control unit 360.

The pattern exposure control unit 360 controls the operation of the illumination system 310, the pattern generation device 320, the stage device 340, etc., and forms the image of the pattern sequentially generated by the variable forming mask 321 on the wafer $W_0$ held on the stage 341 via the projection optical system 330.

In a case that the variable forming mask 321 is illuminated by the illumination light IL from the illumination system 310, the illumination light IL reflected by the micromirrors M1 in the on state of the variable forming mask 321, that is the illumination light IL given a pattern by the variable forming mask 321, enters the projection optical system 330, and a reduced image (partially inverted image) of the pattern is formed in a projection area IA on the wafer $W_0$ held on the stage 341.

Figure 7:
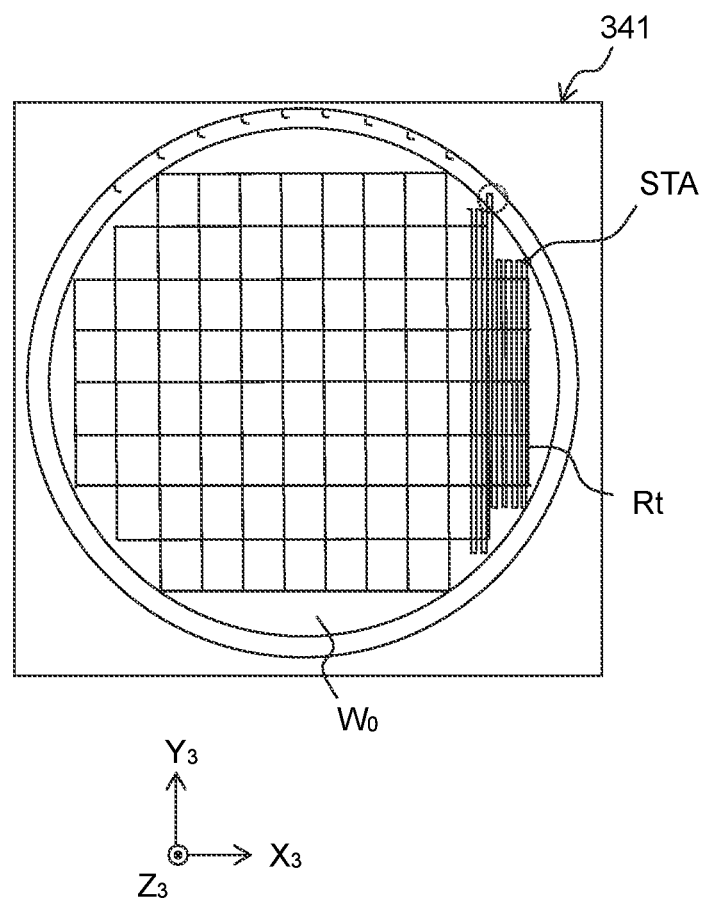
FIG. 7 is an explanatory view depicting an aspect of a movement of a projection area with respect to a wafer in an exposure of a step-and-scan method performed by the pattern exposure section.

In the present embodiment, the pattern exposure control unit 360 performs the exposure in a step-and-scan method as indicated by the route Rt in FIG. 7. That is, first, scan exposure (scanning exposure) is performed by moving the projection area IA to the -$Y_3$-side (i.e., by moving the stage 341 to the +$Y_3$-side) from a start point STA located on the most positive side in the $X_3$ direction within the exposure objective area (shot area) on the wafer $W_0$. Next, a stepping operation in which the projection area IA is moved to the -$X_3$-side (i.e., the stage 341 is moved to the +$X_3$-side) is performed. Next, a scan exposure is performed by moving the projection area IA to the +$Y_3$-side (i.e., by moving the stage 341 to the -$Y_3$-side). Thereafter, the scan exposure and stepping operation are repeated to perform the exposure with respect to the entire of an area to be exposed. The area extending in the $Y_3$ direction exposed by a single scan exposure is referred to as "exposure area".

During the scan exposure, the pattern exposure control unit 360 moves the stage 341 at an appropriate speed while scrolling the pattern generated by the variable forming mask 321 in synchronization therewith (i.e., changing the shape of the pattern generated by the variable forming mask 321). The width of the projection area IA in the $X_3$ direction is about 0.1 to 0.2 mm in the present embodiment.

As the pattern exposure section 300 having the above configuration, the exposure apparatuses disclosed in U.S. Pat. No. 8,089,616 or U.S. Patent Publication No. 2020/00257205 may be used.

[Mask Exposure Section 400]

The mask exposure section 400 is configured to expose a pattern that is determined in advance and formed on a reticle (photomask) onto the photosensitive layer of the wafer $W_0$.

Figure 8:
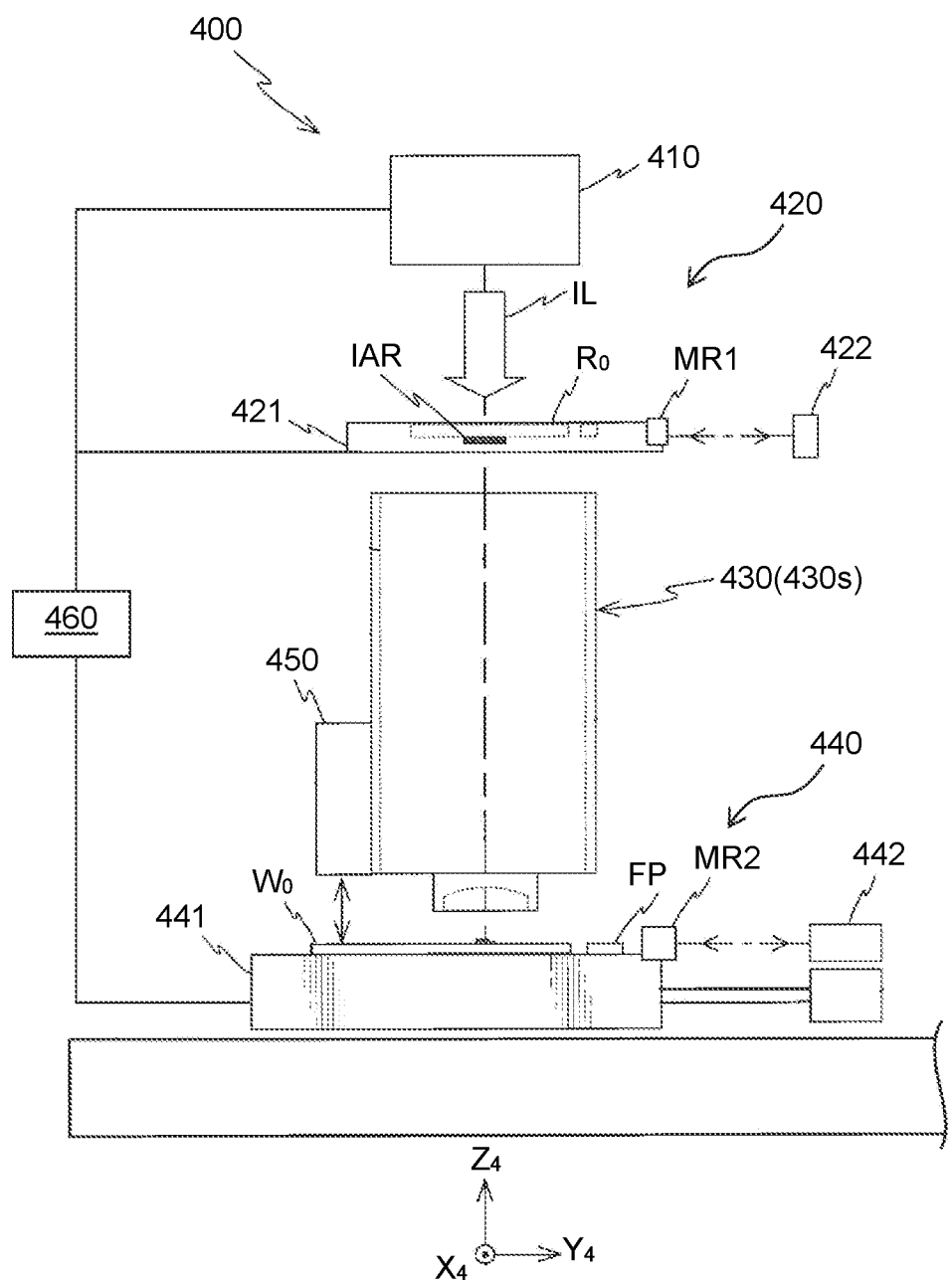
FIG. 8 is a schematic view depicting an overall configuration of a mask exposure section.
Figure 9:
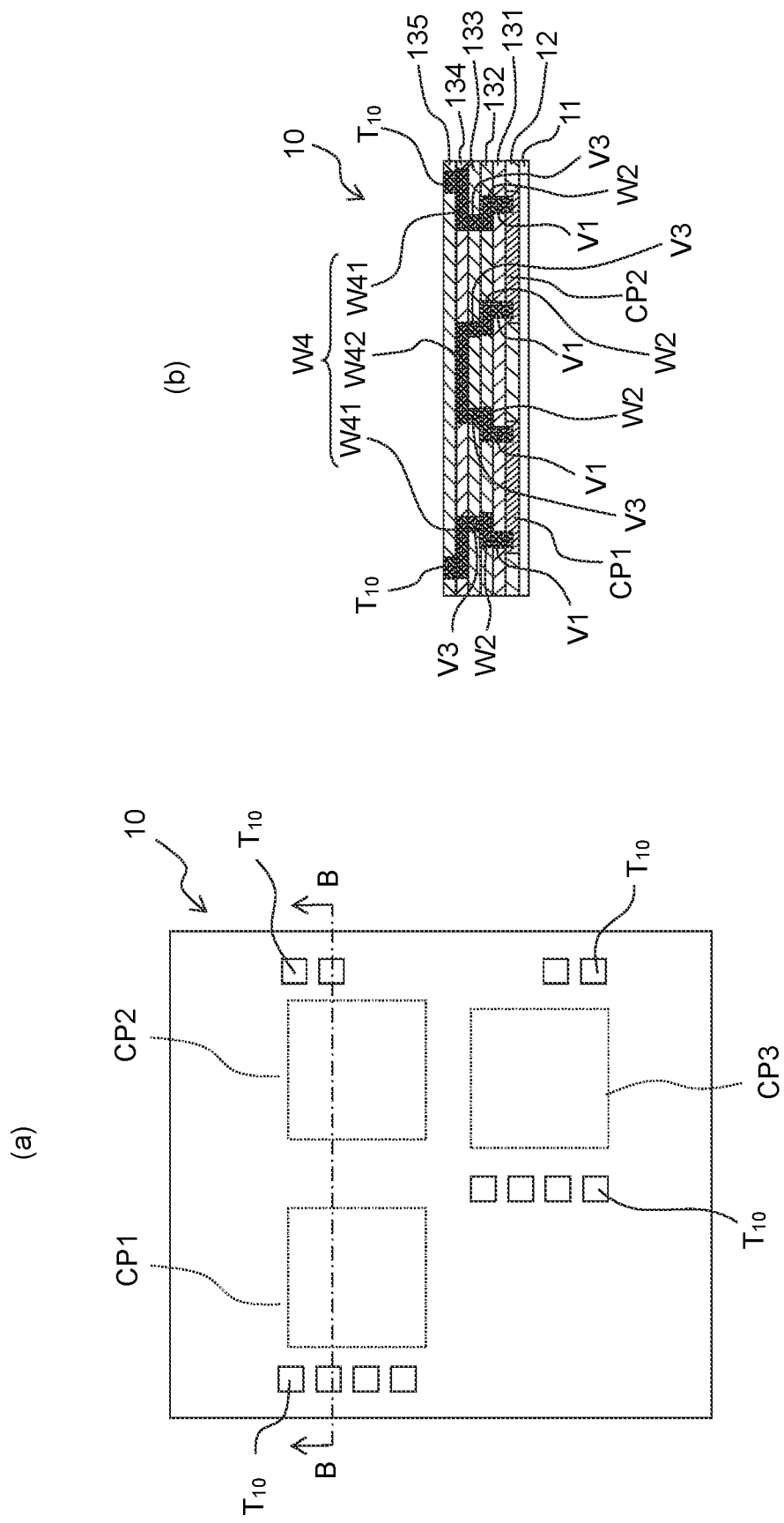
FIGS. 9(a) and 9(b) FIG. 9(a) is a plan view of a semiconductor device according to an embodiment of the present invention.
Figure 10:
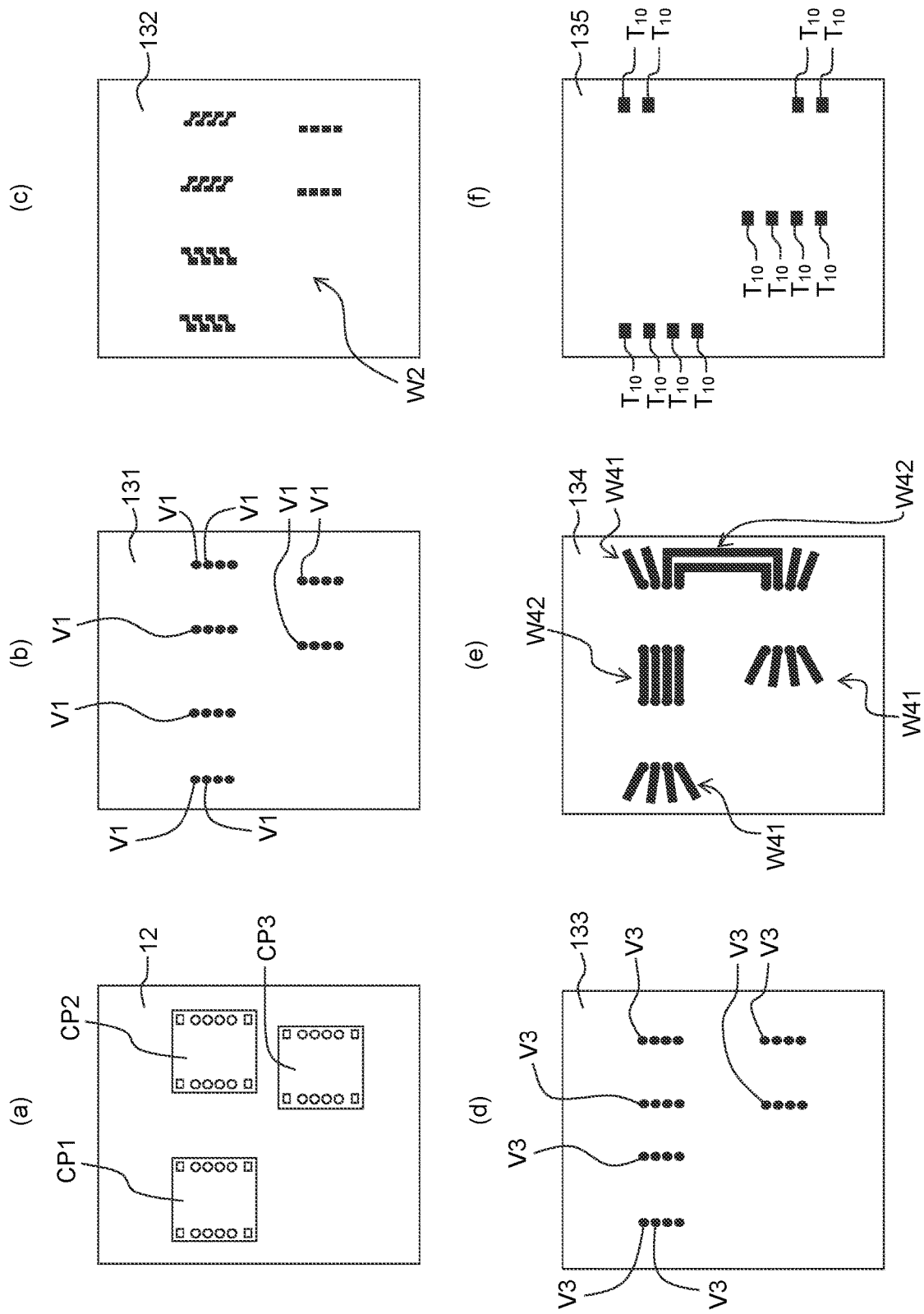
FIGS. 10(a) to 10(f) FIG. 10(a) is a top view of a fixing layer of a device of FIG. 9(a).

As depicted in FIG. 8, the mask exposure section 400 mainly includes an illumination system 410, a reticle stage device 420, a projection optical system 430, a wafer stage device 440, an alignment detection system 450, and a mask exposure control unit 460. In the description of the mask exposure section 400, two directions orthogonal to each other in the horizontal plane are defined as $X_4$ direction and $Y_4$ direction, and the vertical direction is defined as $Z_4$ direction.

The illumination system 410 includes a light source and an illumination optical system (both not depicted) connected to the light source via a light transmission optical system. The light source is an ArF excimer laser light source (wavelength 193 nm) as an example. The illumination optical system irradiates the illumination area IAR on the reticle $R_0$ held on the reticle stage 421 of the reticle stage system 420 with the illumination light from the light source with nearly uniform illuminance. The illumination area IAR is a slit-like area extending long and narrow in the $X_4$ direction.

The reticle stage system 420 mainly includes a reticle stage 421 and a reticle laser interferometer 422.

The reticle stage 421 holds the reticle $R_0$ via a holder provided at the center part of the reticle stage 421. The reticle stage 421 can be driven finely in the $X_4$ direction and the $Y_4$ direction, and can be driven within a predetermined stroke range in the scanning direction (the $Y_4$ direction), by an undepicted reticle stage drive system.

The reticle laser interferometer 422 continuously detects the position in each of the $X_4$ direction, the $Y_4$ direction, and the $\theta Z_4$ direction of the reticle stage 421, by irradiating a moving mirror MR1 provided on the end surface of the reticle stage 421 with a length-measuring beam, with a resolution of, for example, about 0.25 nm.

The projection optical system 430 projects the pattern formed on the reticle $R_0$ onto the wafer $W_0$ arranged on a wafer stage 441 (described below) while reducing at a predetermined projection magnification (for example, ¼×, ⅕×, ⅛×, etc.). The projection optical system includes a lens barrel 430s and a plurality of optical elements (not depicted) arranged in the lens barrel 430 in a predetermined positional relationship.

The wafer stage device 440 mainly includes a wafer stage 441 and a laser interferometer 442.

The wafer stage 441 holds a wafer $W_0$ via a wafer holder (not depicted) provided at the center of the top surface of the wafer stage 441. The wafer stage 441 is driven in the $X_4$ direction and the $Y_4$ direction at predetermined strokes, and is also driven finely in the $Z_4$ direction, the $\theta X_4$ direction, the $\theta Y_4$ direction, and the $\theta Z_4$ direction, by an undepicted stage drive system.

The laser interferometer 442 continuously detects position information of the wafer stage 441 in the $X_4$ direction, the $Y_4$ direction, the $\theta Z_4$ direction, the $\theta X$ direction, and the $\theta Y_4$ direction with a resolution of, for example, about 0.25 nm, by irradiating a moving mirror MR2 provided on the end surface of the wafer stage 441 with a length-measuring beam.

The alignment detection system 450 is provided on the side surface of the lens barrel 430s of the projection optical system 430. The alignment detection system 450 detects an alignment mark, etc. formed on the wafer. As the alignment detection system 450, a field image alignment (FIA) system being a type of the image-forming alignment sensor of the image processing system, may be used. An alignment system of a diffracted light interference type may be used instead of or in addition to the alignment system of the image-processing system.

The mask exposure control unit 460 comprehensively controls the illumination system 410, the reticle stage device 420, the projection optical system 430, and the wafer stage device 440 so as to form an image of the pattern formed on the reticle $R_0$ held by the reticle stage device 420 onto the wafer $W_0$ held on the wafer stage 441 via the projection optical system 430. The mask exposure control unit 460 of the present embodiment controls each part so at to perform exposure in the step-and-scan method.

As the mask exposure section 400 having the above configuration, the exposure apparatus disclosed in the specification of U.S. Pat. No. 10,684,562 may be used.

[Device Manufacturing Method]

A device manufacturing method for manufacturing semiconductor devices using the exposure system ES will be described, taking as an example the case of manufacturing the semiconductor device 10 depicted in FIGS. 9(a), 9(b) and FIGS. 10(a) to 10(f).

As depicted in FIG. 9(a) and FIG. 9(b), the semiconductor device 10 has a stacked structure in which a substrate 11, a fixing layer 12, a first insulating layer 131, a second insulating layer 132, a third insulating layer 133, a fourth insulating layer 134, and a fifth insulating layer 135 are stacked in this order from the bottom.

The substrate 11 is a flat plate formed of silicon.

The fixing layer 12 is formed of an insulating material such as polyimide as an example. As depicted in FIG. 9(b) and FIG. 10(a), semiconductor chips CP1, CP2, CP3 are provided in the fixing layer 12.

The semiconductor chips CP1 to CP3 have the same configuration as each other. Hereafter, each of the semiconductor chips CP1 to CP3 is simply referred to as semiconductor chip CP in a case that it is unnecessary to distinguish the semiconductor chips CP1 to CP3 from each other.

Figure 11:
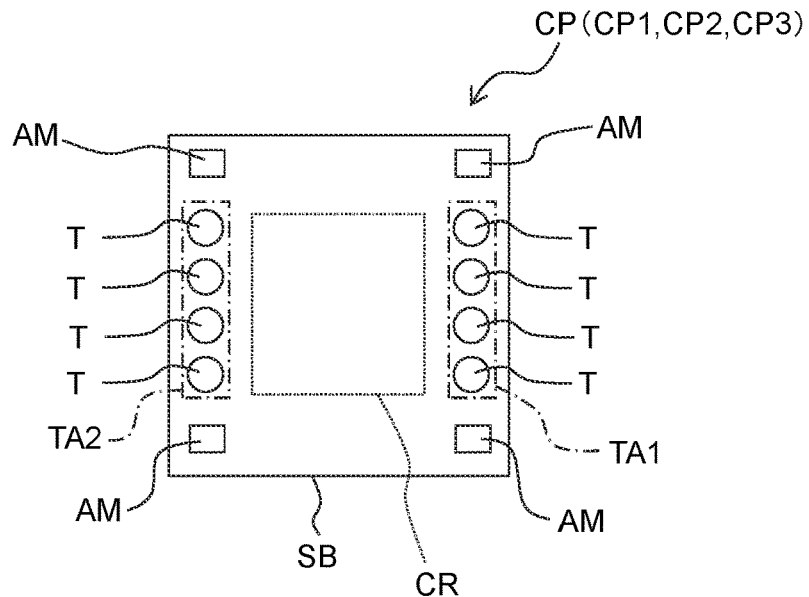
FIG. 11 is a top view of a semiconductor chip provided in the semiconductor device according to the embodiment of the present invention.

As depicted in FIG. 11, the semiconductor chip CP has a substrate SB substantially square in a plan view, a circuit CR, a plurality of draw-out electrodes T (eight pieces), and four alignment marks (chip alignment marks) AM. Regarding the semiconductor chip CP, the direction in which the four draw-out electrodes T are arranged side by side in FIG. 11 is referred to as an electrode arrangement direction (uniaxial direction), and the direction in the plane of the substrate SB and orthogonal to the electrode arrangement direction is referred to as an orthogonal direction.

The substrate SB is a flat plate formed of resin or the like.

The circuit CR is provided in the center part in a plan view of the substrate SB. The circuit CR is designed to perform a predetermined function and is provided on the substrate SB.

Each of the eight draw-out electrodes T is an electrode (terminal) for connecting the circuit CR to an outside of the semiconductor chip CP. Each of the eight draw-out electrodes is connected to the circuit CR via a wiring (not depicted) provided in the substrate SB.

Each of the eight draw-out electrodes T is provided on the top surface of the substrate SB in the area where the circuit CR is not provided in the plan view of the substrate SB. Four of the eight draw-out electrodes T are provided on one side in the orthogonal direction of the circuit CR while being arranged side by side in a row (aligned) in the electrode arrangement direction. The remaining four of the eight draw-out electrodes T are provided on the other side in the orthogonal direction of the circuit CR while being arranged side by side in a row (aligned) in the electrode arrangement direction.

The area which is defined on one side in the orthogonal direction of the circuit CR and in which the four draw-out electrodes T are provided is referred to as a first electrode formation area TA1. The area which defined on the other side in the orthogonal direction of the circuit CR and in which the four draw-out electrodes T are provided is referred to as a second electrode formation area TA2. Each of the first and second electrode formation areas TA1 and TA2 is a long area extending along the electrode arrangement direction.

Each of the first and second electrode formation areas TA1 and TA2 is an area outside the circuit CR in the plan view of the substrate SB, and no circuit CR is provided in the first and second electrode formation areas TA1 and TA2. The circuit CR is interposed between the first and second electrode formation areas TA1 and TA2 in the orthogonal direction.

Each of the first and second electrode formation areas TA1 and TA2 is defined at a position separated from the center part of the substrate SB in the orthogonal direction. The first electrode formation area TA1 and the second electrode formation area TA2 localize separated from each other in the orthogonal direction.

In this embodiment, the draw-out electrode T is provided only in the area where the circuit CR is not provided, in the orthogonal direction of the semiconductor chip CP.

Four alignment marks AM are provided one at each of the four corners of the substrate SB. Each of the alignment marks AM may be a cross-shaped mark, a box-shaped mark, etc.

The first insulating layer 131 to the fifth insulating layer 135 are formed of an insulating material such as silicon dioxide ($SiO_2$) as an example.

As depicted in FIG. 9(b) and FIG. 10(b), a plurality of vias V1 is provided in the first insulating layer 131. The plurality of vias V1 is provided on the draw-out electrodes T of the semiconductor chips CP1 to CP3, respectively.

As depicted in FIG. 9(b) and FIG. 10(c), a relay wiring (relay wiring layer) W2 is provided in the second insulating layer 132. The relay wiring W2 of the semiconductor device 10 of this embodiment is composed of a set of wirings connected to a plurality of vias V1 respectively (details will be described below). The relay wiring W2 connects the vias V1 and vias V3 (described below).

As depicted in FIG. 9(b) and FIG. 10(d), a plurality of vias V3 is provided in the third insulating layer 133. The plurality of vias V3 connects to a plurality of wirings constituting the relay wiring W2, respectively.

As depicted in FIG. 9(b) and FIG. 10(e), a re-wiring (re-wiring layer) W4 is provided in the fourth insulating layer 134. The re-wiring W4 of the semiconductor device 10 of this embodiment includes an output wiring (output wiring layer) W41 and an inter-chip wiring (inter-chip wiring layer) W42.

The output wiring W41 is composed of a set of wirings in each of which one end is located at the position of the via V3 and the other end is located at a position different from the position of the via V3. The output wiring W41, together with the vias V1, V3 and the relay wiring W2, connects the semiconductor chips CP1 to CP3 and the electrodes $T_{10}$ (described below).

The inter-chip wiring W42 is composed of a set of wirings in each of which one end is located at the position of one via V3 and the other end is located at the position of a via V3 different from the one via V3. The inter-chip wiring W42, together with the vias V1, V3 and the relay wiring W2, connects the semiconductor chips CP1 to CP3 to each other.

As depicted in FIG. 9(b) and FIG. 10(f), a plurality of electrodes (electrode layer) $T_{10}$ is provided in the fifth insulating layer 135. The electrodes $T_{10}$ are provided on the ends of the plurality of wirings composing the output wiring W41, respectively, the ends being ends opposite to the ends connected to the vias V3.

Figure 12:
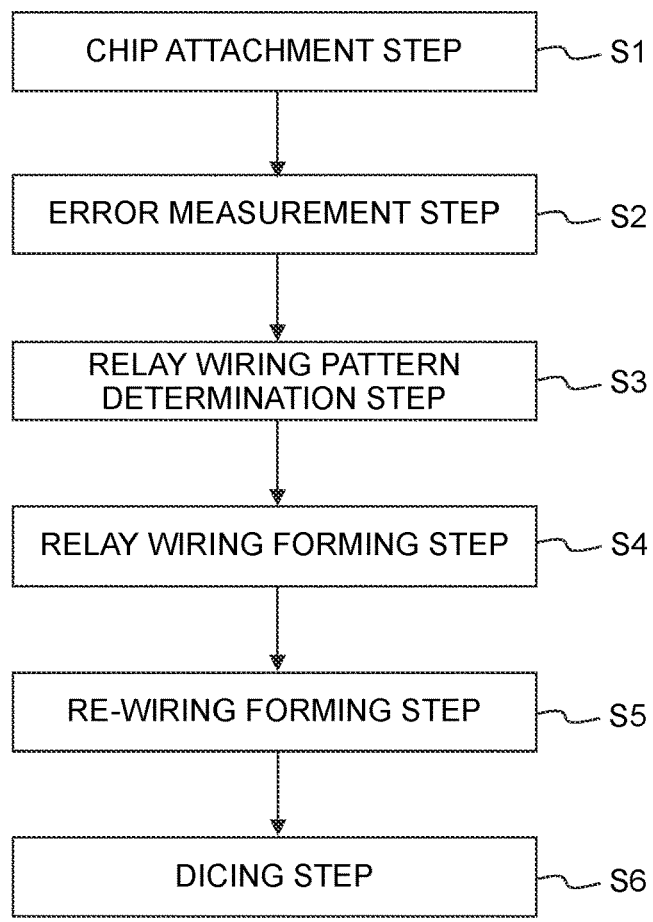
FIG. 12 is a flowchart depicting a device manufacturing method according to an embodiment of the present invention.
Figure 13:
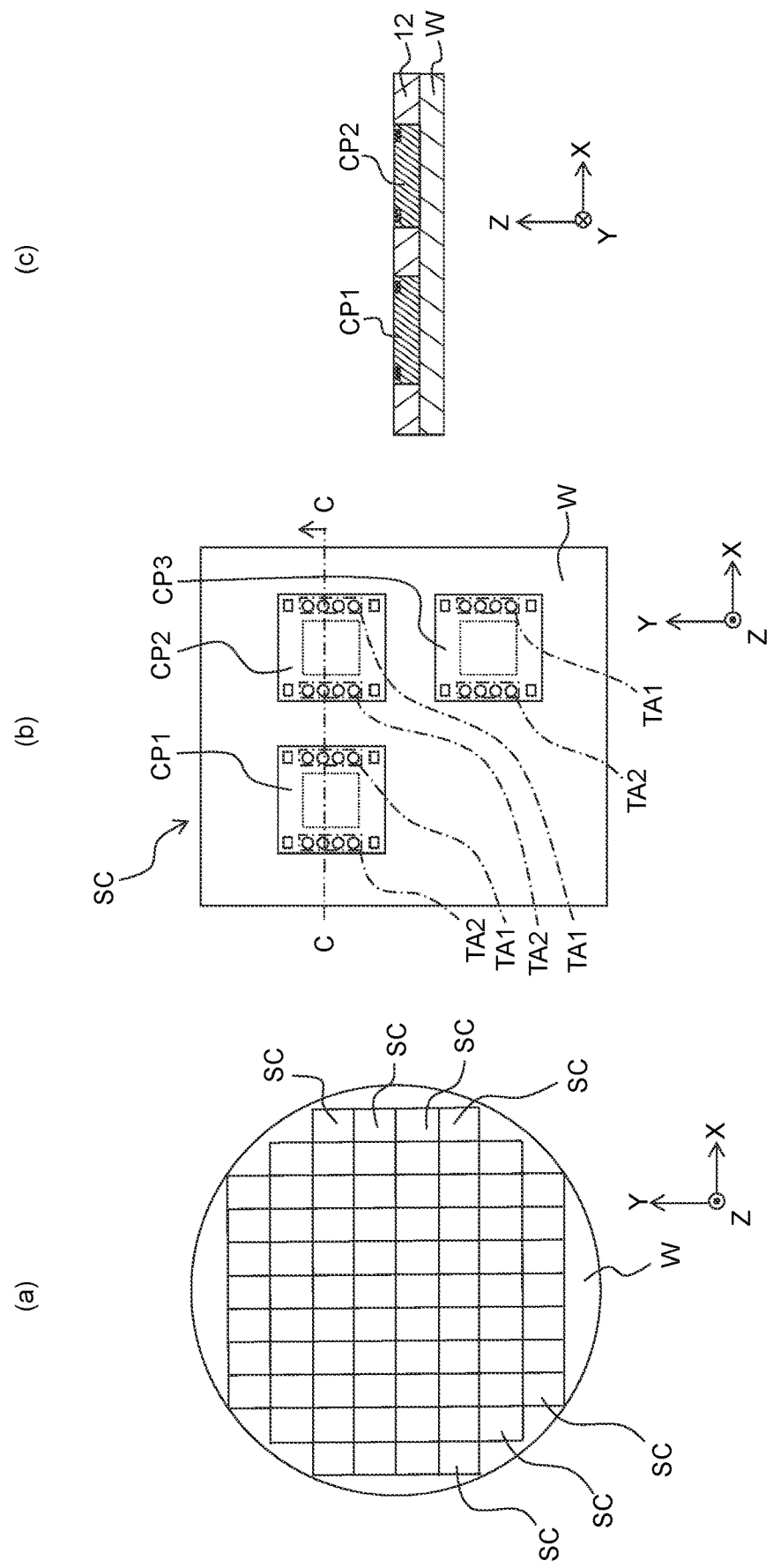
FIGS. 13(a) to 13(c) FIG. 13(a) is a plan view of a wafer used in the device manufacturing method.

The device manufacturing method of the present embodiment mainly includes a chip attachment step S1, an error measurement step S2, a relay wiring pattern determination step S3, a relay wiring formation step S4, a re-wiring formation step S5, and a dicing step S6, as depicted in the flowchart of FIG. 12.

[Chip Attachment Step S1]

In the chip attachment step S1, a wafer W is prepared and a plurality of semiconductor chips is attached onto the wafer W. In the present embodiment, a silicon wafer of 300 mm in diameter depicted in FIG. 13(a) is used as the wafer W.

First, the wafer W is divided into a plurality of sections SC as depicted in FIG. 13(a). Each of the plurality of sections SC is rectangular and is arranged in a matrix on the wafer W. In the following description, the short and long directions of the section SC are referred to as X and Y directions, respectively, of the section SC and the wafer W. The thickness direction of the wafer W is referred to as Z direction of the section SC and the wafer W. Note that a circuit pattern may be formed on the wafer W. In this case, the plurality of sections SC may be divided by street lines between the plurality of circuit pattern formation areas on the wafer W.

Next, semiconductor chips CP1 to CP3 (FIG. 11) are attached to each of the plurality of sections SC.

In the present embodiment, the semiconductor chips CP1 to CP3 are arranged in the section SC so that the semiconductor chips CP1 and CP2 are arranged side by side in the X direction and the semiconductor chips CP2 and CP3 are arranged side by side in the Y direction (FIG. 13(b)).

The semiconductor chips CP1 to CP3 are arranged in the section SC such that the electrode arrangement directions of the semiconductor chips CP1 to CP3 match with the Y direction of the section SC and the orthogonal directions of the semiconductor chips CP1 to CP3 match with the X direction of the section SC.

In the state depicted in FIG. 13(b), the semiconductor chip CP1 and the semiconductor chip CP2 are arranged side by side in the X direction, and the draw-out electrodes T of the semiconductor chip CP1 and the draw-out electrodes T of the semiconductor chip CP2 are located at the same position in the Y direction. Also, the semiconductor chips CP2 and the semiconductor CP3 are arranged side by side in the Y direction, and the draw-out electrodes T of the semiconductor chip CP2 and the draw-out electrodes T of the semiconductor chip CP3 are located at the same position in the X direction. The electrode arrangement directions of the semiconductor chips CP1 to CP3 match with each other.

The first electrode formation area TA1 of the semiconductor chip CP2 and the first electrode formation area TA1 of the semiconductor chip CP3 are aligned on single straight line along the Y direction, and the second electrode formation area TA2 of the semiconductor chip CP2 and the second electrode formation area TA2 of the semiconductor chip CP3 are aligned on single straight line along the Y direction. By aligning the first electrode formation area TA1 or the second electrode formation area TA2 of the plurality of semiconductor chips CP on single straight line as above, in the exposure by the pattern exposure section 300, the exposure area extending in the $Y_3$ axis direction (that is, an area to be exposed in the scan exposure of one time) and the first electrode formation areas TA1 or the second electrode formation areas TA2 of the plurality of semiconductor chips CP can be overlapped. This enables efficient exposure by the pattern exposure section 300 (details will be described below).

In the following description, the position(s) of the semiconductor chips CP1 to CP3 arranged as depicted in FIG. 13(b) are referred to as "designed position(s)".

After arranging the semiconductor chips CP1 to CP3 in each of the sections SC of the wafer W, the fixing layer 12 is formed by using resin to fix the semiconductor chips CP1 to CP3 to the wafer W. The top surface of the fixing layer 12 and the top surfaces of the semiconductor chips CP1 to CP3 may be flush with each other (FIG. 13(c)).

In this specification, an object obtained when the chip attachment step S1 is completed, that is the object in which the semiconductor chip(s) CP is/are attached to the wafer W by the fixing layer 12, may be considered as a device.

[Error Measurement Step S2]

In a case that the semiconductor chips CP1 to CP3 are attached to the wafer W in the chip attachment step S1, the semiconductor chips CP1 to CP3 are often fixed to the wafer W in a state that the semiconductor chips CP1 to CP3 are deviated from the designed position(s) (FIG. 13(b)). Positional deviation(s) (misalignment) of the semiconductor chips CP1 to CP3 relative to the designed position(s) is caused, for example, by non-uniform shrinkage of the resin when the resin is cured to form the fixing layer 12, etc.

Figure 14:
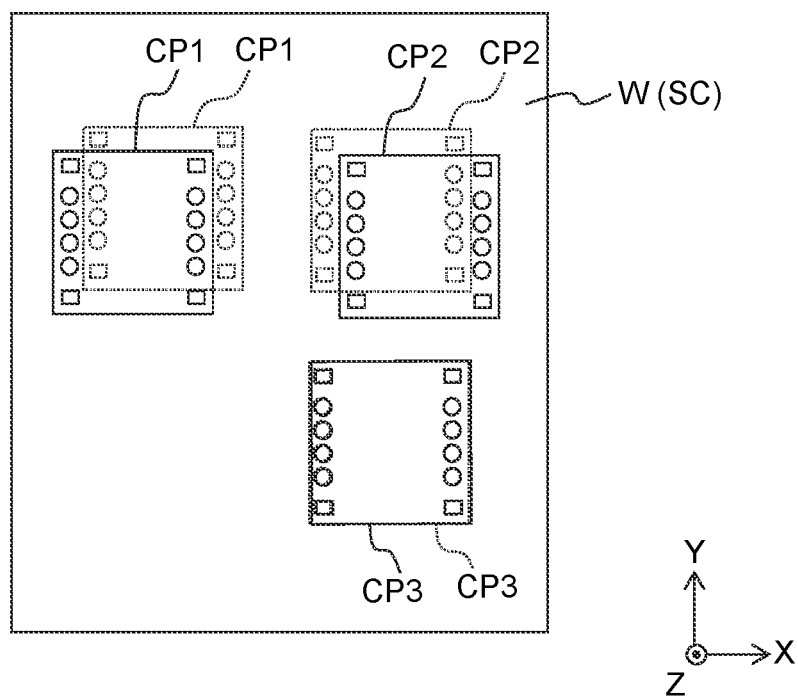
FIG. 14 is a plan view of one of the sections on the wafer, and depicts designed positions for semiconductor chips and the semiconductor chips deviated from the designed positions.

FIG. 14 depicts an example of the positional deviation(s). In FIG. 14, the designed positions of the semiconductor chips CP1 to CP3 are depicted by dotted lines, and the actual positions of the semiconductor chips CP1 to CP3 are depicted by solid lines. The semiconductor chip CP1 is shifted in the −X and −Y directions relative to the designed position. The semiconductor chip CP2 is shifted in the +X and −Y directions relative to the designed position. The semiconductor chip CP3 is not deviated from the designed position.

In the error measurement step S2, regarding the semiconductor chips CP1 to CP3 in each of the sections SC, deviation amounts $\Delta X$ being amounts of deviation in the X direction relative to the designed positions, deviation amounts $\Delta Y$ being amounts of deviation in the Y direction relative to the designed positions, and deviation amounts 40 being amounts of deviation in a rotational direction around the axis extending in the Z direction relative to the designed positions, are measured by the measurement section 100. The combination of the deviation amount $\Delta X$ in the X direction, the deviation amount $\Delta Y$ in the Y direction, and the deviation amount $\Delta\theta$ in the rotational direction around the axis extending in the Z direction is hereinafter referred to as "positional deviation information DI".

First, a wafer W is placed on the wafer holder 122 of the slider 120 of the measurement section 100. At this time, the wafer W is placed such that the X and Y directions of the wafer W match with the $X_1$ and $Y_1$ directions, respectively, of the measurement section 100.

Next, the alignment marks (substrate alignment marks) (not depicted) of the wafer W and the alignment marks (chip alignment marks) AM of the semiconductor chips CP1 to CP3 are detected by the mark detection system 141 of the measurement section 100.

The position of each section SC on the wafer W and the designed positions of the semiconductor chips CP1 to CP3 in each section SC are known. Thus, the designed positions of the semiconductor chips CP1 to CP3 can be obtained by detecting the alignment marks on the wafer W. Further, since each of the semiconductor chips CP1 to CP3 has four alignment marks AM arranged at the four corners of each of the semiconductor chips CP1 to CP3, the actual position of each of the semiconductor chips CP1 to CP3 can be obtained based on the detections of the four alignment marks AM.

Therefore, based on the detection results of the alignment marks of the wafer W and the detection results of the alignment marks AM of each of the semiconductor chips CP1 to CP3, the positional deviation information DI of each of the semiconductor chips CP1 to CP3 can be calculated. The calculation of the positional deviation information DI is performed, for example, by the measurement control unit 170 of the measurement section 100.

The measurement control unit 170 outputs the obtained positional deviation information DI to the pattern determination section 200.

[Relay Wiring Pattern Determination Step S3]

In the relay wiring pattern determination step S3, the pattern determination section 200 determines the pattern of the relay wiring W2 for each of the sections SC. The reason for forming the relay wiring W2 in the device manufacturing method of the present embodiment is as follows.

In the device manufacturing method of the present embodiment, in the re-wiring formation step S5 described below, the pattern of re-wiring W4 (FIG. 10(e)) is formed by using exposure by the mask exposure section 400. Here, the pattern of the re-wiring W4 is designed based on the semiconductor chips CP1 to CP3 arranged at the designed positions (FIG. 13(b)). Therefore, if the actual positions of the semiconductor chips CP1 to CP3 are deviated from the designed positions as depicted in FIG. 14 for example, connection defects such as disconnection can occur between the draw-out electrodes T of the semiconductor chips CP1 to CP3 and the re-wiring W4.

Therefore, in the device manufacturing method of the present embodiment, the relay wiring W2 (FIG. 10(c)), which is composed of a set of straight wirings extending between the positions of the draw-out electrodes T of the semiconductor chips CP1 to CP3 at the actual positions and the positions of the draw-out electrodes T of the semiconductor chips CP1 to CP3 at the designed positions, is formed. As a result, even if the actual positions of the semiconductor chips CP1 to CP3 are deviated from the designed positions, the semiconductor chips CP1 to CP3 and the re-wiring W4 are appropriately connected via the relay wiring W2.

Here, the pattern of the relay wiring W2 varies depending on the manner of the positional deviation of the semiconductor chip CP with respect to the designed position. Therefore, in the relay wiring pattern determination step S3, the pattern of the relay wiring W2 is determined based on the positional deviation information D1 obtained in the error measurement step S2 for each of the semiconductor chips CP1 to CP3.

Specifically, for example, the pattern of the relay wiring W2 is determined as follows.

First, the determination unit 220 of the pattern determination section 200 receives the positional deviation information D1 of each of the semiconductor chips CP1 to CP3 from the measurement control unit 170 of the measurement section 100 via the reception unit 230.

Next, the determination unit 220 determines the pattern of the relay wiring W2 for each of the semiconductor chips CP1 to CP3 based on the received positional deviation information D1 and the table TB stored in the memory unit 210.

In the table TB, many kinds of positional deviation information D1 and many kinds of pattern information PI are stored in a manner that the many kinds of positional deviation information D1 and the many kinds of pattern information PI are correlated with each other. Each of the many kinds of pattern information PI includes a pattern of the relay wiring W2 suitable for the corresponding positional deviation information DI. That is, in the table TB, various types of positional deviation that the semiconductor chip CP can have and patterns of the relay wiring W2 that should be formed for the semiconductor chip CP having said positional deviation are stored in a manner that the various types of positional deviation and the patterns are correlated with each other.

Figure 15:
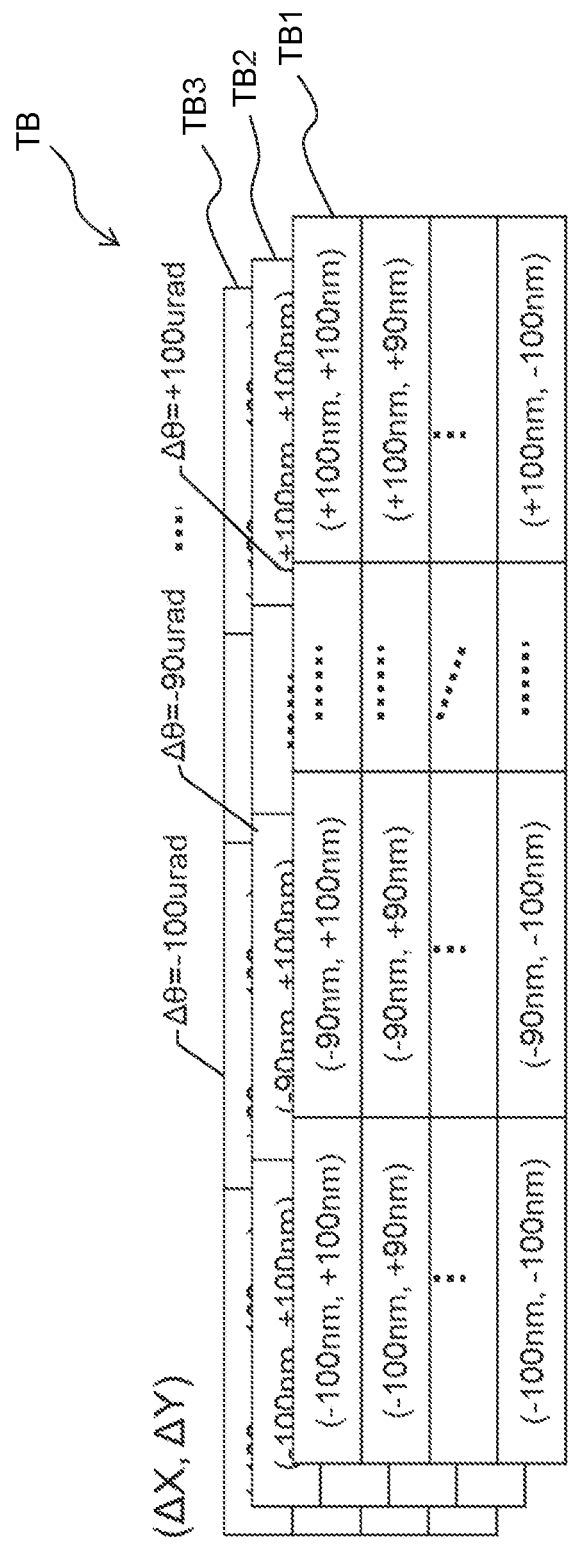
FIG. 15 is an explanatory view depicting an outline of a table.

Specifically, for example, the table TB1 depicted in FIG. 15 stores, for various combinations of the deviation amount $\Delta X$, the deviation amount $\Delta Y$, and the deviation amount $\Delta \theta$, the pattern information PI corresponding to each of the combinations. Here, each of the deviation amount $\Delta X$ and the deviation amount $\Delta Y$ includes predetermined values in 10 nm increments between −100 [nm] and +100 [nm], and the deviation amount $\Delta \theta$ is +100 [μrad].

Similarly, the table TB2 depicted in FIG. 15 stores, for various combinations of the deviation amount $\Delta X$, the deviation amount $\Delta Y$, and the deviation amount $\Delta \theta$, the pattern information PI corresponding to each of the combinations. Here, each of the deviation amount $\Delta X$ and the deviation amount $\Delta Y$ includes predetermined values in 10 nm increments between −100 [nm] and +100 [nm], and the deviation amount $\Delta \theta$ is −90 [μrad]. The table TB3 depicted in FIG. 15 stores, for various combinations of the deviation amount $\Delta X$, the deviation amount $\Delta Y$, and the deviation amount $\Delta \theta$, the pattern information PI corresponding to each of the combinations. Each of the deviation amount $\Delta X$ and the deviation amount $\Delta Y$ includes predetermined values in 10 nm increments between −100 [nm] and +100 [nm], and the deviation amount $\Delta \theta$ is −100 [μrad].

In addition to the tables TB1 to TB3, the table TB includes a plurality of tables that store corresponding pattern information PI for various combinations of the deviation amount $\Delta X$, the deviation amount $\Delta Y$, and the deviation amount $\Delta \theta$.

Figure 16:
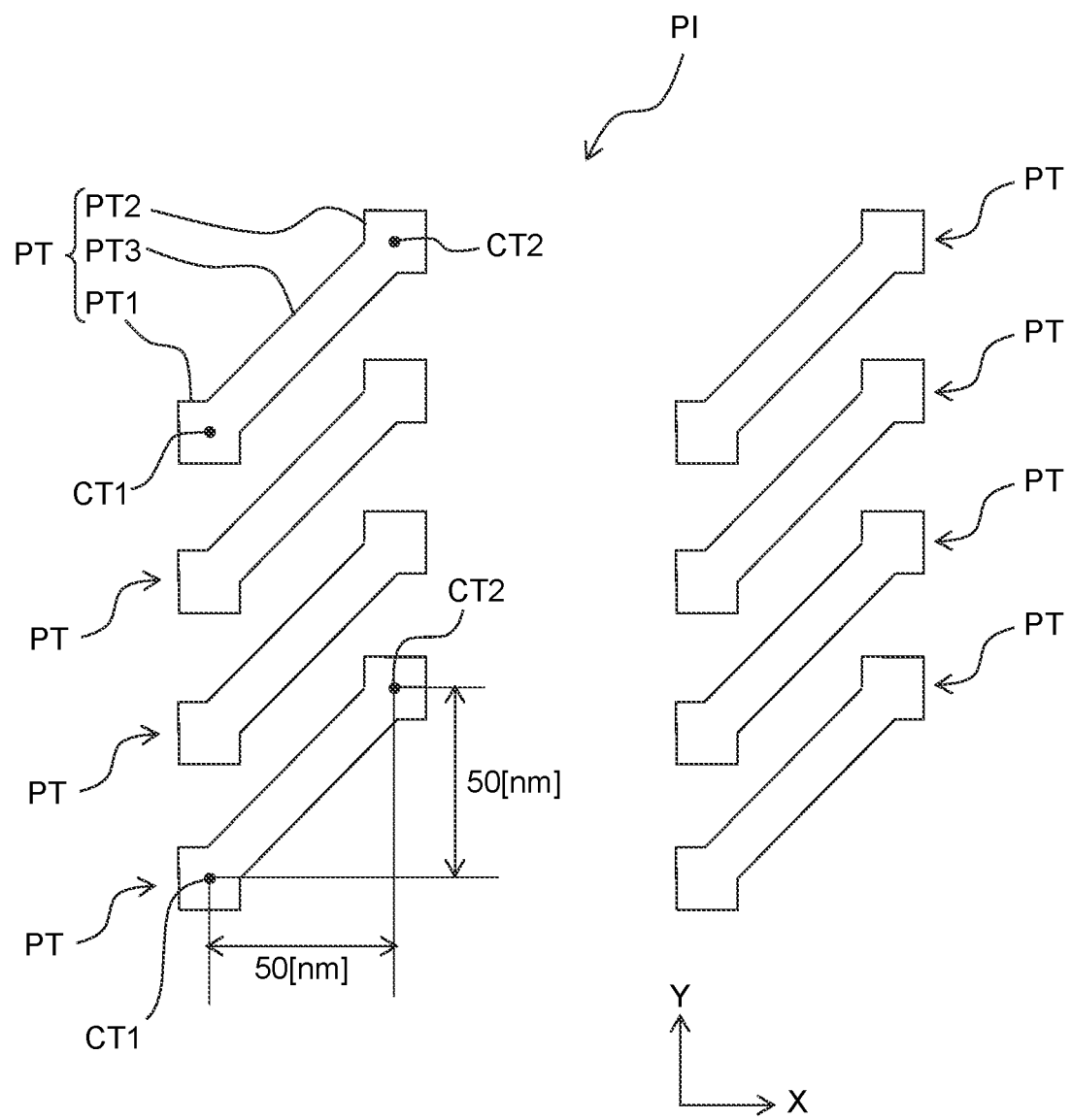
FIG. 16 is a schematic view depicting an example of pattern information stored in the table.
Figure 17:
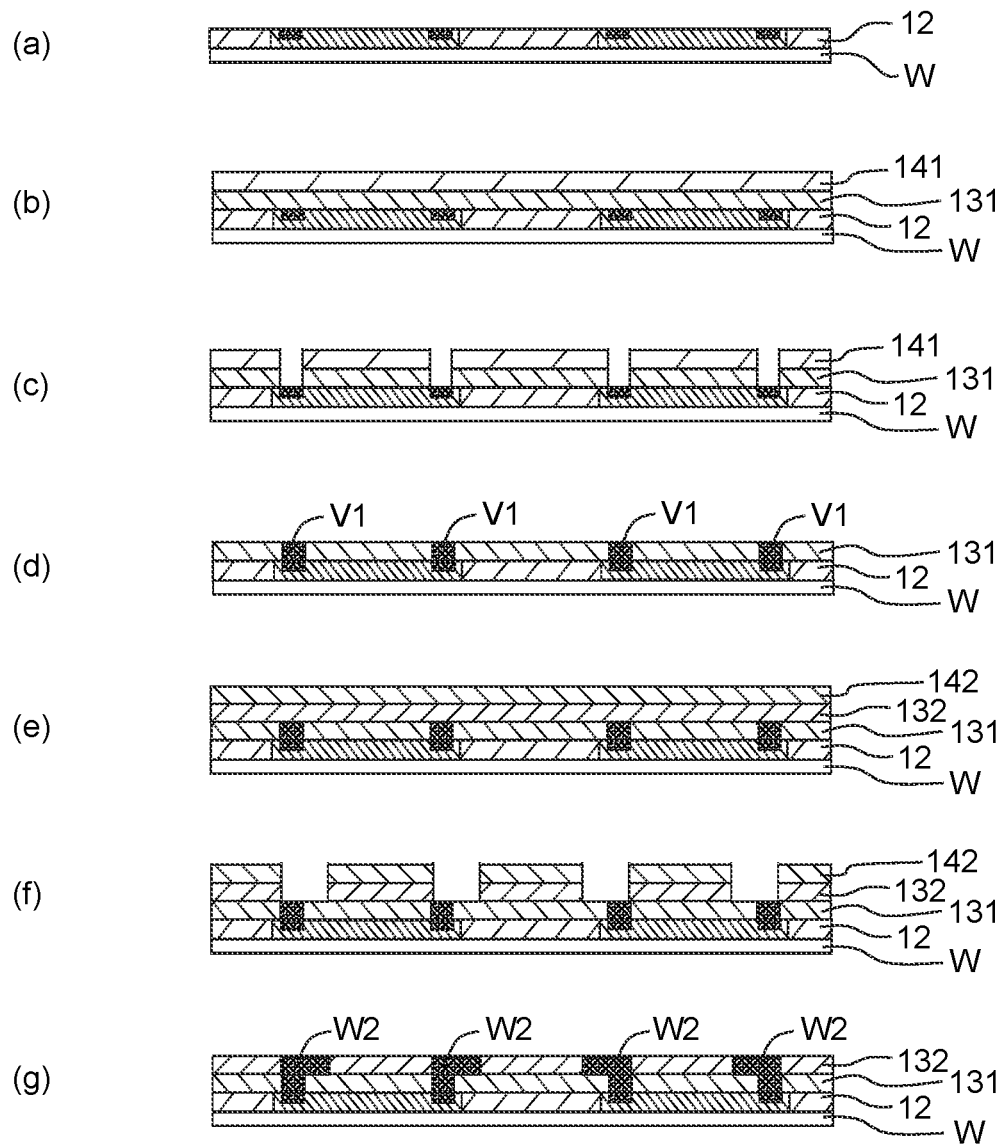
FIGS. 17(a) to 17(g) Each of FIGS. 17(a) to 17(g) is a cross-sectional view for explaining steps for forming the relay wiring layer on the semiconductor chip in a relay wiring formation step. The position of the cross section of each of FIGS. 17(a) to 17(g) is same as the position of the cross section taken along C-C line in FIG. 13(b).
Figure 18:
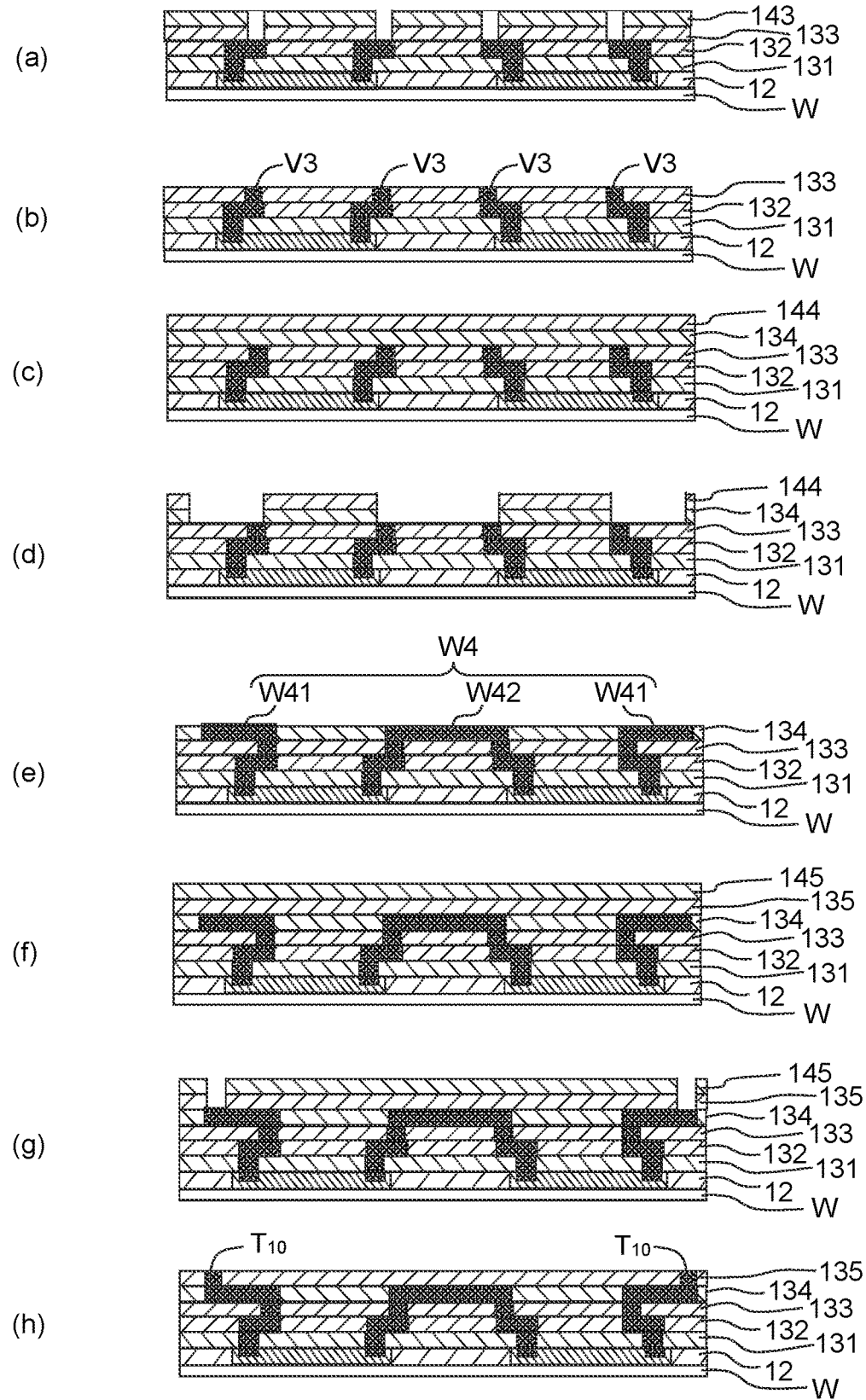
FIGS. 18(a) to 18(h) Each of FIGS. 18(a) to 18(h) is a cross-sectional view for explaining steps for forming the re-wiring layer on the semiconductor chip in a re-wiring formation step. The position of the cross section of each of FIGS. 18(a) to 18(h) is same as the position of the cross section taken along C-C line in FIG. 13(b).

Each of the plurality of kinds of the pattern information PI includes eight patterns PT extending between the eight draw-out electrodes T of the semiconductor chip CP located at the actual position and the eight draw-out electrodes T of the semiconductor chip CP located at the designed position (FIG. 16).

The pattern information PI depicted in FIG. 16 is the pattern information PI corresponding to the positional deviation information D1 where the deviation amount $\Delta X$ is −50 [nm], the deviation amount $\Delta Y$ is −50 [nm] and the deviation amount $\Delta \theta$ is 0 [μrad]. Each of the eight patterns PT included in this pattern information PI includes a first end part PT1 having a substantially square shape, a second end part PT2 having a substantially square shape, and a straight part PT3 extending between the first end part PT1 and the second end part PT2.

The center CT1 of the first end part PT1 is separated from the center CT2 of the second end part PT2 by 50 [nm] in the X direction and 50 [nm] in the Y direction. That is, each of the patterns PT is designed so that in a case that the first end part PT1 is formed at the position of the draw-out electrode T of the semiconductor chip CP at the actual position, the second end part PT2 is located at the position of the draw-out electrode T of the semiconductor chip CP at the designed position.

At least one of the length (wiring length) and extension direction of the straight part PT3 of the included pattern PT is different among the plurality of pieces of the pattern information PI. In the pattern information PI corresponding to the positional deviation information D1 in which the deviation amount $\Delta \theta$ is 0 [μrad], the length and extending direction of the straight parts PT3 of the eight patterns PT are identical to each other, as depicted in FIG. 16. On the other hand, in the pattern information PI corresponding to the positional deviation information D1 in which the deviation amount $\Delta \theta$ is not 0 [μrad], the length and extending direction of the straight parts PT3 of the eight patterns PT are not identical to each other.

In a case that the deviation amount $\Delta X$, the deviation amount $\Delta Y$ and the deviation amount $\Delta \theta$ are all zero or negligibly small, a combination of patterns each including only the first end part PT1 without including the second end part PT2 and straight part PT3, and each having a substantially square shape is selected.

For each of the semiconductor chips CP1 to CP3, the determination unit 220 reads the deviation amount $\Delta X$, the deviation amount $\Delta Y$, and the deviation amount $\Delta \theta$ included in the positional deviation information D1 received from the measurement section 100, and selects the pattern information PI corresponding to the combination of the read deviation amounts $\Delta X$, $\Delta Y$, $\Delta \theta$ from the table TB. Then, the pattern indicated by the selected pattern information PI is determined to be the pattern of the relay wiring W2 for the semiconductor chip concerned.

The determination unit 220 sends the determined pattern to the pattern exposure section 300 as an exposure pattern.

[Relay Wiring Formation Step S4]

In the relay wiring formation step S4, the relay wiring(s) W2 having the patterns determined in the relay wiring pattern determination step S3 is formed above the semiconductor chips CP1 to CP3 in each section SC. Specifically, the relay wiring W2 is formed, for example, by the following procedure.

(1) A first insulating layer 131 is formed on the fixing layer 12 (FIG. 17(a)), and a first photosensitive layer 141 is formed on the first insulating layer 131 (FIG. 17(b)). Note that, if the fixing layer 12 covers the top of the semiconductor chip CP, the first photosensitive layer 141 may be formed on the fixing layer 12 without forming the first insulating layer 131 because the fixing layer 12 serves as the first insulating layer 131.

(2) The pattern of the vias V1 (FIG. 10(b)) generated by the pattern generation device 320 is projected onto the first photosensitive layer 141 by using the pattern exposure section 300. The scan exposure by the pattern exposure section 300 is performed in a state that the scanning direction matches with the electrode arrangement directions of the semiconductor chips CP1 to CP3. Then, a portion of the first photosensitive layer 141 and a portion of the first insulating layer 131 each located at the position where the pattern of the vias V1 has been exposed are removed (FIG. 17(c)), and after the remaining portion of the first photosensitive layer 141 is also removed, a conductor (copper as an example) is embedded in recesses left in the first insulating layer 131 (FIG. 17(d)). As a result, the vias V1 are formed in the first insulating layer 131.

The vias V1 are formed at the positions of the draw-out electrodes T of the semiconductor chips CP1 to CP3 located at the actual positions. The positions of the vias V1 can be determined based on the measurement results of the error measurement step S2.

(3) A second insulating layer 132 is formed on the first insulating layer 131, and a second photosensitive layer 142 is formed on the second insulating layer 132 (FIG. 17(e)).

(4) The pattern of the relay wiring W2 (FIG. 10(c)) (i.e., the patterns determined in the relay pattern determination step S3) generated by the pattern generation device 320 is projected onto the second photosensitive layer 142 by using the pattern exposure section 300. The scan exposure by the pattern exposure section 300 is performed in a state that the scanning direction matches with the electrode arrangement directions of the semiconductor chips CP1 to CP3 (that is, the Y direction of the wafer W). Then, a portion of the second photosensitive layer 142 and a portion of the second insulating layer 132 each located at the position where the pattern of the relay wiring W2 has been exposed are removed (FIG. 17(f)), and after the remaining portion of the second photosensitive layer 142 is also removed, a conductor is embedded in recesses left in the second insulating layer 132 (FIG. 17(g)). As a result, the relay wiring (the relay wiring layer) W2 is formed in the second insulating layer 132. Note that, a flattening process (e.g., CMP) of the first insulating layer 131 may be performed before the forming of the second insulating layer 132 on the first insulating layer 131 in which the vias V1 are formed, and/or the flattening process of the second insulating layer 132 in which the relay wiring W2 is formed may be performed. The flattening process of the first insulating layer 131 before the vias V1 are formed therein may also be performed.

[Re-Wiring Formation Step S5]

In the re-wiring formation step S5, the re-wiring W4 having a pattern determined in advance and the electrodes $T_{10}$ are formed above the relay wiring W2 in each section SC. Specifically, the re-wiring W4 is formed by the following procedure, for example.

(1) The third insulating layer 133 is formed on the second insulating layer 132, and a third photosensitive layer 143 is formed on the third insulating layer 133. Then, the pattern of the vias V3 (FIG. 10(d)) formed on the reticle (photomask) in advance is projected onto the third photosensitive layer 143 by using the mask exposure section 400, and a portion of the third photosensitive layer 143 and a portion of the third insulating layer 133 each located at the position where the pattern of the vias V3 is exposed are removed (FIG. 18(a)). After the remaining portion of the third photosensitive layer 143 is also removed, a conductor is embedded in recesses left in the third insulating layer 133 (FIG. 18(b)). As a result, the vias V3 are formed in the third insulating layer 133. The vias V3 are formed at the positions of the draw-out electrodes T of the semiconductor chips CP1 to CP3 located at the designed positions. Here, the flattening process may be performed after the formation of the third insulating layer 133.

(2) The fourth insulating layer 134 is formed on the third insulating layer 133, and a fourth photosensitive layer 144 is formed on the fourth insulating layer 134 (FIG. 18(c)). Note that, the flattening process may be performed after the formation of the fourth insulating layer 134.

(3) The pattern (mask pattern) of the re-wiring W4 (FIG. 10(e)) formed on the reticle (photomask) in advance is projected onto the fourth photosensitive layer 144 by using the mask exposure section 400. Then, a portion of the fourth photosensitive layer 144 and a portion of the fourth insulating layer 134 each located at a position where the pattern of the re-wiring W4 is exposed are removed (FIG. 18(d)), and after the remaining portion of the fourth photosensitive layer 144 is also removed, a conductor is embedded in recesses left in the fourth insulating layer 134 (FIG. 18(e)). As a result, the re-wiring (re-wiring layer) W4 is formed in the fourth insulating layer 134.

(4) The fifth insulating layer 135 is formed on the fourth insulating layer 134, and the fifth photosensitive layer 145 is formed on the fifth insulating layer 135 (FIG. 18(f)).

(5) The pattern of the electrodes $T_{10}$ (FIG. 10(f)) formed on the reticle is projected onto the fifth photosensitive layer 145 by using the mask exposure section 400. Then, a portion of the fifth photosensitive layer 145 and a portion of the fifth insulating layer 135 each located at a position where the pattern of the electrodes $T_{10}$ is exposed are removed (FIG. 18(g)). Then, after removing of the remaining portion of the fifth photosensitive layer 145, a conductor is embedded in recesses left in the fifth insulating layer 135 (FIG. 18(h)). By doing so, the electrodes $T_{10}$ are formed in the fifth insulating layer 135.

[Dicing Process S6]

In the dicing step S6, the wafer W is cut according to the sections SC. By doing so, a plurality of the semiconductor devices 10 (eighty-six pieces in the present embodiment) is formed. Each part of the cut wafer W becomes a substrate 11 of the semiconductor device 10 (here, the unit of the cutting is the section SC).

The effects of the exposure system ES and the device manufacturing method using the exposure system ES of the present embodiment are summarized as follows.

The exposure system ES of the present embodiment includes a pattern determination section 200 configured to determine the pattern of the relay wiring W2, and the pattern exposure section 300 configured to form the relay wiring W2 having the pattern determined by the pattern determination section 200. The device manufacturing method of the present embodiment includes the relay wiring pattern determination step S3 in which the pattern of the relay wiring W2 is determined by using the pattern determination section 200, and the relay wiring formation step S3 in which the relay wiring W2 having the determined pattern is formed by using the pattern exposure section 300.

Accordingly, even in a case that the positions of the semiconductor chips CP1 to CP3 arranged on the wafer W are deviated from the designed positions, the re-wiring W4 designed to be connected to the semiconductor chips CP1 to CP3 located at the designed positions and the semiconductor chips CP1 to CP3 located at the positions deviated from the designed positions are relayed (electrically connected) by the relay wiring W2, and thus the re-wiring W4 and the semiconductor chips CP1 to CP3 are connected appropriately.

As a method of connecting a re-wiring and a semiconductor chip located at a position deviated from the designed position, it is conceivable to re-design the pattern of the re-wiring itself based on the positional deviation of the semiconductor chip, as described in Patent Literature 1. However, if the pattern of the re-wiring itself is re-designed each time according to the positional deviation of the semiconductor chip that can be various aspects, a large amount of processing time is required.

In contrast, in the present embodiment, the pattern of the re-wiring itself is not changed, but the relay wiring is formed to relay between the re-wiring and the draw-out electrode of the semiconductor chip located at a position deviated from a designed position. Therefore, there is no need to re-design the pattern of the re-wiring, and devices can be manufactured at high throughput.

Since the pattern of the re-wiring itself is not changed in the exposure system ES and the device manufacturing method using the exposure system ES of the present embodiment, the formation of the re-wiring can be performed by the mask exposure section 400 using a reticle (photomask) in which a pattern of the re-wiring is formed in advance. Therefore, devices can be manufactured at higher throughput compared to the method of Patent Literature 1 in which re-designed re-wiring is formed by using a pattern exposure machine.

Further, in the exposure system ES and the device manufacturing method using the exposure system ES of the present embodiment, the table TB that stores correspondence between many kinds of positional deviation information D1 and many kinds of pattern information PI is used in the determination of the pattern of the relay wiring W2. Therefore, after obtaining the positional deviation information D1 of the semiconductor chip CP, the pattern of the relay wiring W2 can be determined quickly by referring to the table TB, without requiring complicated processing.

In the exposure system ES and the device manufacturing method using the exposure system ES of the present embodiment, the draw-out electrodes T of each of the semiconductor chips CP1 to CP3 are provided only in the first and second electrode formation areas TA1 and TA2 each extending in the electrode arrangement direction at a position outside the circuit CR. The semiconductor chips CP1 to CP3 are arranged in the section SC on the wafer W so that the electrode arrangement directions thereof match with each other. Further, the semiconductor chip CP2 and the semiconductor chip CP3 are arranged such that the first electrode formation area TA1 of the semiconductor chip CP2 and the first electrode formation area TA1 of the semiconductor chip CP3 are aligned on single straight line and the second electrode formation area TA2 of the semiconductor chip CP2 and the second electrode formation area TA2 of the semiconductor chip CP3 are aligned on single straight line.

Therefore, in a case that the relay wiring W2, the vias V1 and/or the vias V3 are formed in the relay wiring formation step S4, it is not necessary to expose the entire area in the X direction of the section SC, but it is sufficient to expose only a partial area where the first and second electrode formation areas TA1 and TA2 of the semiconductor chips CP1 to CP3 exist.

This is particularly advantageous in view of the fact that the exposure in the relay wiring formation step S4 is performed by the pattern exposure section 300. That is, the width in the X direction (non-scanning direction) of the projection area IA of the pattern exposure section 300 is generally about 0.1 to 0.2 mm and is small. Therefore, if the electrodes of the semiconductor chip are located in the entire area in the X direction of the section SC, a very large number of scan exposures and stepping operations are required in the exposure of the step-and-scan method.

Figure 19:
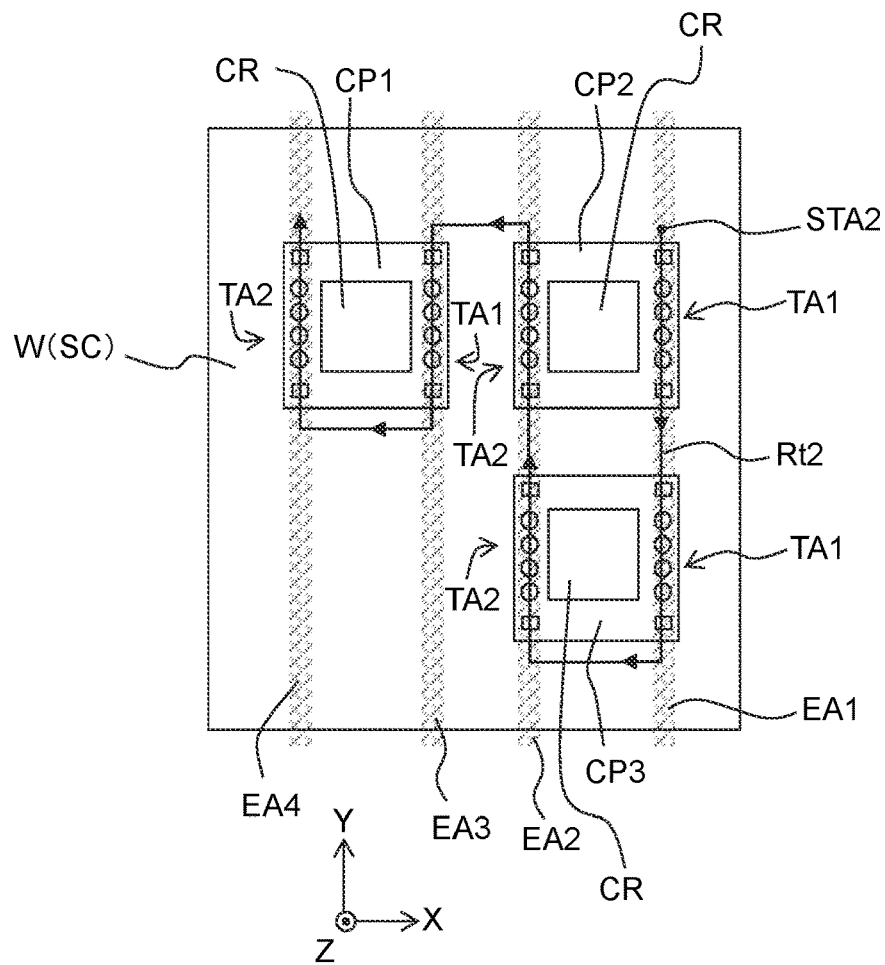
FIG. 19 is a plan view of one section on the wafer. An aspect of a movement of a projection area with respect to a semiconductor chip in a case that a pattern of a relay wiring is exposed by a pattern exposure section in a relay wiring formation step of the embodiment is depicted in FIG. 19.

In contrast, in the exposure system ES and the device manufacturing method using the exposure system ES of the present embodiment, as depicted in FIG. 19, it is sufficient to preform exposure to a first exposure area EA1 overlapping with the first electrode formation area TA1 of the semiconductor chips CP2 and CP3, a second exposure area EA2 overlapping with the second electrode formation areas TA2 of the semiconductor chips CP2 and CP3, a third exposure area EA3 overlapping with the first electrode formation area TA1 of the semiconductor chip CP1, and a fourth exposure area EA4 overlapping with the second electrode formation area TA2 of the semiconductor chip CP1. Therefore, for example, as depicted by the route Rt2 in FIG. 19, the exposure to one section SC can be completed by four scan exposures and three step operations after starting the scan exposure from the start point STA2.

As described above, in the exposure system ES and the device manufacturing method using the exposure system ES of the present embodiment, the draw-out electrodes T of the semiconductor chips CP1 to CP3 localize at a partial area in the X direction of the section SC. Therefore, the exposure by the pattern exposure section 300 in the relay wiring formation step S4 can be performed efficiently and the throughput of the device manufacturing can be increased.

<Modifications>

In the above embodiment, the following modifications can also be adopted.

In the above embodiment, the semiconductor chips CP1 to CP3 have the same configuration as each other. However, there is no limitation thereto. The semiconductor chips CP1 to CP3 may have different configurations from each other. Further, the number and arrangement of the draw-out electrode(s) T in each of the semiconductor chips CP1 to CP3 are also arbitrary. In the first electrode formation area TA1 and/or the second electrode formation area TA2, a plurality of rows in each of which the draw-out electrodes T are arranged side by side in the electrode arrangement direction may be provided side by side in the orthogonal direction. The number and arrangement of the alignment marks AM provided on the semiconductor chip CP may be set arbitrarily so that the necessary positional deviation information D1 can be obtained.

The number of semiconductor chip(s) arranged in the section SC and the location and arrangement of the semiconductor chip(s) arranged in the section SC are arbitrary.

However, in a case that a plurality of semiconductor chips is arranged and each semiconductor chip has the draw-out electrodes arranged side by side in a predetermined direction, the number of times of the scan exposure by the pattern exposure section 300 can be reduced by arranging the plurality of semiconductor chips so that the predetermined directions of the plurality of semiconductor chips match with each other. In addition, by arranging the plurality of semiconductor chips side by side so that the electrode formation areas of the plurality of semiconductor chips are arranged side by side on single straight line, the number of times of the scan exposures by the pattern exposure section 300 can be further reduced.

In the above embodiment, the error measurement step S2 is performed by using the measurement section 100. However, there is no limitation thereto. For example, the error measurement step S2 may be performed by using the alignment detection system 350 of the pattern exposure section 300. In this case, the measurement section 100 may be omitted from the exposure system ES.

In the pattern determination unit 200 of the above embodiment, the memory unit 210 stores the table TB, and the determination unit 220 selects one pattern information PI from the table TB to determine the pattern of the relay wiring W2.

However, there is no limitation thereto. The memory section 210 may store a coarse adjustment table and a fine adjustment table instead of the table TB, and the determination unit 220 may combine one pattern information selected from the coarse adjustment table and one pattern information selected from the fine adjustment table to determine the pattern of the relay wiring W2.

In this case, for example, the coarse adjustment table stores correspondence between many kinds of the positional deviation information D1 and many kinds of coarse adjustment pattern information, and the fine adjustment table stores correspondence between many kinds of the positional deviation information D1 and many kinds of fine adjustment pattern information.

Figure 20:
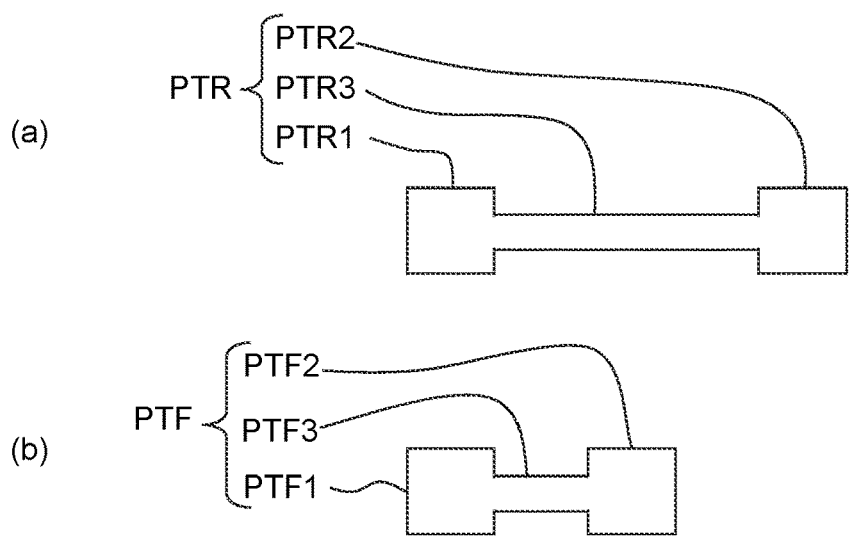
FIGS. 20(a) and 20(b) FIG. 20(a) is a schematic view depicting one example of a coarse adjustment pattern stored in a coarse adjustment table according to a modification.

Eight coarse adjustment patterns PTR (patterns of the first relay wiring) (FIG. 20(a)) included in each of the coarse adjustment pattern information has a first end part PTR1 having substantially square shape, a second end part PTR2 having substantially square shape, and a straight part PTR3 extending between the first end part PTR1 and the second end part PTR2.

Eight fine adjustment patterns PTF (patterns of the second relay wiring) (FIG. 20(b)) included in each of the fine adjustment pattern information has a first end part PTF1 having substantially square shape, a second end part PTF2 having substantially square shape, and a straight part PTF3 extending between the first end part PTF1 and the second end part PTF2.

The straight part PTR3 of the coarse adjustment pattern PTR may be longer than the straight part PTF3 of the fine adjustment pattern PTF. A length adjustment range of the straight part PTR3 of the coarse adjustment pattern PTR may be wider than a length adjustment range of the straight part PTF3 of the fine adjustment pattern PTF. As an example, the lengths of the straight parts PTR3 of the many kinds of coarse adjustment pattern PTR are within a range of about 10 µm to 12 µm, and the lengths of the straight parts PTF3 of the many kinds of fine adjustment pattern PTF are within a range of about 10 µm to 10.2 µm.

In the determined pattern of the relay wiring W2, the first end part PTR1 of the coarse adjustment pattern PTR is formed at the position of the draw-out electrode T of the semiconductor chip CP, and the second end part PTR2 of the coarse adjustment pattern PTR is arranged at a position slightly separated from the re-wiring W4 (first position). Then, the first end part PTF1 of the fine adjustment pattern PTF is formed at the position of the second end part PTR2 of the coarse adjustment pattern PTR and the second end part PTF2 of the fine adjustment pattern PTF is formed at the position connecting to the re-wiring W4 (second position). The portion formed based on the coarse adjustment pattern PTR and the portion formed based on the fine adjustment pattern PTF of the relay wiring W2 may be formed as one wiring layer in the same insulating layer or may be formed in different insulating layers from each other.

By dividing the table TB into the coarse adjustment table and the fine adjustment table as described above, the amount of information required to be stored in the memory unit 210 can be reduced. For example, suppose that it is necessary to store one hundred types of pattern information PI corresponding to one hundred types of positional deviation information D1 in a case of using the table TB. In such a case, if the fine adjustment table and the coarse adjustment table are used, it is possible to provide one hundred types of pattern information by multiplying ten types of coarse adjustment pattern information stored in the coarse adjustment table and ten types of fine adjustment pattern information stored in the fine adjustment table. In other words, it is sufficient to store twenty types of pattern information in total.

In the above embodiment, the pattern of the re-wiring W4, and the pattern information PI for determining the pattern of the relay wiring W2 are designed such that a point pattern extending neither in the X direction nor in the Y direction is selected as the pattern of the relay wiring W2 in a case that there is no positional deviation in the semiconductor chip CP or in a case that the positional deviation is negligibly small.

However, there is no limitation thereto. The pattern of the re-wiring W4 and the pattern information PI may be designed such that a straight pattern extending in a direction crossing the electrode arrangement direction of the semiconductor chip CP is selected in a case that there is no misalignment of the semiconductor chip CP.

By doing so, as depicted in FIG. 21 for example, the relay wiring W2 can be formed without causing a short circuit between the patterns PT even in a case that the actual position of semiconductor chip CP (solid line in FIG. 21) deviates significantly from the designed position of semiconductor chip CP (dotted line in FIG. 21) in the electrode arrangement direction.

In the table TB of the above embodiment, the number of the positional deviation information D1 that are made to correspond to one type of pattern information PI is arbitrary. It is not essential to form the relay wiring W2 such that the draw-out electrode T of the semiconductor chip CP is positioned at the center part of the first end part PT1 of the pattern PT, but it is sufficient if the relay wiring W2 is formed such that the draw-out electrode T of the semiconductor chip CP is electrically connected to the first end part PT1. Therefore, one type of pattern information PI can cover a plurality of types of positional deviation conditions similar to each other.

The table TB of the above embodiment is configured as follows. That is, regarding the deviation amounts $\Delta X$ and $\Delta Y$, the pattern information PI corresponding there to is changed every 10 [nm]. Regarding the deviation amount $\Delta \theta$, the pattern information PI corresponding there to is changed every 10 [µrad]. However, the table may be configured such that the pattern information PI corresponding to $\Delta X$ and/or $\Delta Y$ and/or $\Delta \theta$ is changed at a larger cycle or at a smaller cycle.

In the above embodiment, the pattern determination section 200 determines the pattern of the relay wiring W2 by using the table TB stored in the memory unit 210. However, there is no limitation thereto. The pattern determination section 200 may determine the pattern of relay wiring W2 without using the table TB. Specifically, for example, the pattern of the relay wiring W2 may be derived by a predetermined calculation process based on the positional deviation information DI.

In addition to the draw-out electrodes T arranged side by side along the electrode arrangement direction, the semiconductor chips CP1 to CP3 may be further provided with the draw-out electrodes T which are arranged side by side in the orthogonal direction and which are arranged on both sides of the circuit CR in the electrode arrangement direction.

In a case of exposing the pattern of the relay wiring W2 to such semiconductor chips CP1 to CP3 by the pattern exposure section 300, first, the wafer W is placed on the stage 341 such that the Y direction of the wafer W matches with the $Y_3$ direction of the pattern exposure section 300. Then, as depicted in FIG. 22, the exposure of the step-and-scan method is performed from the starting point STA3 along the route Rt3 to expose the first exposure area EA1, second exposure area EA2, third exposure area EA3 and fourth exposure area EA4. By doing so, exposure for forming the relay wiring W2 connected to the draw-out electrodes T arranged side by side in the electrode arrangement direction of the semiconductor chips CP1 to CP3 is performed.

Next, the wafer W is rotated 90° around an axis extending in the Z direction, and the wafer W is placed on the stage 341 such that the X direction of the wafer W matches with the $Y_3$ direction of the pattern exposure section 300. Then, as depicted in FIG. 22, the exposure of the step-and-scan method is performed from the starting point STA4 along the route Rt4 to expose a fifth exposure area EA5, a sixth exposure area EA6, a seventh exposure area EA7 and an eighth exposure area EA8. As a result, exposure for forming the relay wiring W2 connected to the draw-out electrodes T arranged side by side in the orthogonal direction of the semiconductor chips CP1 to CP3 is performed.

In a case that the exposure to the draw-out electrodes T arranged side by side in the orthogonal direction is performed by the scan exposure along the electrode arrangement direction (the Y direction of the wafer W), the number of times of the scan exposure increases because the existence area of the draw-out electrodes T in the orthogonal direction (the X direction of the wafer W) is wide. However, by rotating the wafer W to change the scanning direction, the exposure can be performed efficiently.

In the above embodiment, the pattern determination section 200 is provided separately from the pattern exposure section 300 and the mask exposure section 400. However, there is no limitation thereto. The pattern determination section 200 may be provided as a part of the pattern exposure section 300 or the mask exposure section 400. Further, the pattern exposure section 300 equipped with the pattern determination section 200 or the mask exposure section 400 equipped with the pattern determination section 200 may be configured as an exposure apparatus independent from the exposure system ES.

In the above embodiment, all of the patterns of the re-wiring W4 are exposed by the mask exposure system 400. However, there is no limitation thereto. Only at least a portion of the pattern of the re-wiring W4 (the output wiring W41 and/or the inter-chip wiring W42) may be formed on the reticle (photomask), and only at least the portion of the pattern of the re-wiring W4 may be exposed by the mask exposure section 400. The remaining portion of the pattern may be exposed by the pattern exposure section 300.

In the above embodiment, in the relay wiring formation step S4, the pattern of the relay wiring W2 is exposed by using the pattern exposure section 300. However, there is no limitation thereto. In the relay wiring formation step S4, the pattern of the relay wiring W2 may be exposed by using the mask exposure section 400.

In the above embodiment, in the re-wiring formation step S5, the pattern of the re-wiring W4 is exposed by using the mask exposure section 400. However, there is no limitation thereto. In the re-wiring formation step S5, the pattern of the re-wiring W4 may be exposed by using the pattern exposure section 300.

It is not essential that the relay wiring W2 is a wiring that connects the draw-out electrode T of the semiconductor chip CP and the re-wiring W4. The relay wiring W2 may be a wiring connecting the draw-out electrode T and a predetermined position with respect to the wafer W, and the pattern of the relay wiring W2 may be the pattern of such a wiring. In this case, the second end part PT2 of the pattern PT and the second end part PTF2 of the fine adjustment pattern PTF are formed at such predetermined position.

In the above embodiment, a plurality of semiconductor chips CP1 to CP3 are attached to each of a plurality of sections SC of the wafer W. However, one semiconductor chip may be attached to each of a plurality of sections SC. In this case, it is appropriate to arrange the semiconductor chips in the sections SC such that the electrode arrangement direction of the semiconductor chip attached to one section SC and the electrode arrangement direction of the semiconductor chip attached to another section SC located on the Y direction side of the one section SC match with the Y direction (the same direction).

In the above embodiment, a wafer W made of silicon is used. However, there is no limitation thereto. Instead of the wafer W made of silicon, any substrate made of glass, resin, etc. may be used. In the above embodiment, a circular substrate is used, but for example, a square substrate may be used.

As long as the features of the present invention are maintained, the present invention is not limited to the above embodiments, and other aspects that can be considered within the scope of the technical concept of the present invention are also included within the scope of the present invention.

ADDITIONAL NOTE

It is understood by one of ordinary skill in the art that the embodiments and the modifications described above are specific examples of the following aspects.

(Item 1)

A device manufacturing method for manufacturing a device including a plurality of semiconductor chips having a draw-out electrode, a relay wiring having a first end electrically connected to the draw-out electrode, and an output wiring electrically connected to a second end, opposite to the first-end, of the relay wiring, the method comprising:

obtaining a positional deviation of the plurality of semiconductor chips from a designed position by measuring a position of the plurality of semiconductor chips provided on a substrate; and determining a pattern of the relay wiring based on the positional deviation.

(Item 2)

The device manufacturing method according to item 1 further comprising:

forming a photosensitive layer on the plurality of semiconductor chips; and exposing the determined pattern of the relay wiring onto the photosensitive layer by an energy beam travelled via a pattern forming device.

(Item 3)

The device manufacturing method according to item 2 further comprising:

forming the relay wiring by using the photosensitive layer to which the exposing of the determined pattern of the relay wiring has been performed;

forming a different photosensitive layer different from the photosensitive layer on the relay wiring; and exposing a pattern of the output wiring on the different photosensitive layer by an exposure light travelled via a mask having a mask pattern of at least a portion of the output wiring.

(Item 4)

The device manufacturing method according to item 2 or item 3 further comprising exposing the pattern of the relay wiring to an exposure area, on the photosensitive layer, extending in a uniaxial direction in which the plurality of semiconductor chips is arranged, while moving the substrate from a first-side in the uniaxial direction to a second-side, opposite to the first-side, in the uniaxial direction.

(Item 5)

The device manufacturing method according to item 4, wherein the exposure area is a first exposure area, the method further comprising:
moving the substrate on which the plurality of semiconductor chips is provided in a crossing direction crossing the uniaxial direction, after the exposing of the determined pattern of the relay wiring onto the first exposure area; and
exposing the pattern of the relay wiring to a second exposure area, on the photosensitive layer, separated from the first exposure area in the crossing direction, while moving the substrate from the second-side to the first-side in the uniaxial direction.

(Item 6)

The device manufacturing method according to any one of items 1 to 5, wherein the draw-out electrode is provided at an electrode formation area extending along the uniaxial direction on at least one of the semiconductor chips.

(Item 7)

The device manufacturing method according to any one of items 1 to 6, further comprising:
preparing the substrate; and
attaching the plurality of semiconductor chips to a plurality of sections on the substrate.

(Item 8)

The device manufacturing method according to item 7, further comprising cutting the substrate into the plurality of sections.

(Item 9)

The device manufacturing method according to any one of items 1 to 8, wherein the second end of the relay wiring is located at a predetermined position relative to the substrate.

(Item 10)

The device manufacturing method according to any one of items 1 to 9, wherein the determining of the pattern of the relay wiring includes selecting at least one wiring pattern, from a plurality of wiring patterns stored in advance, based on the positional deviation.

(Item 11)

The device manufacturing method according to item 10, wherein each of the plurality of wiring patterns is a pattern of straight shape, and wiring lengths and/or extending directions of the plurality of wiring patterns are different from each other.

(Item 12)

The device manufacturing method according to item 10 or 11, wherein:
the plurality of wiring patterns stored in advance includes:
a plurality of first wiring patterns; and
a plurality of second wiring patterns, a wiring length of each of the plurality of second wiring patterns is shorter than a wiring length of each of the plurality of first wiring patterns; and
the selecting of the at least one wiring pattern from the plurality of wiring patterns stored in advance includes selecting one of the plurality of first wiring patterns and one of the plurality of second wiring patterns.

(Item 13)

The device manufacturing method according to any one of items 1 to 12, wherein:
each of the plurality of semiconductor chips includes a circuit provided at a center part of each of the plurality of semiconductor chips and a plurality of the draw-out electrodes which is electrically connected to the circuit and which is provided outside the circuit in a first direction; and
in each of the plurality of semiconductor chips, the plurality of the draw-out electrodes is arranged side by side in a second direction crossing the first direction.

(Item 14)

The device manufacturing method according to item 13, wherein in a case that the plurality of semiconductor chips is located at the designed position, directions in each of which the plurality of the draw-out electrodes of one of the plurality of semiconductor chips is arranged side by side match with each other, among the plurality of semiconductor chips.

(Item 15)

The device manufacturing method according to item 14, wherein:
the determining of the pattern of the relay wiring includes selecting at least one wiring pattern, from a plurality of wiring patterns stored in advance, based on the positional deviation; and
a pattern extending in a direction crossing the second direction is selected as the at least one wiring pattern, in a case that the positional deviation does not exist.

(Item 16)

The device manufacturing method according to item 2 or 3, wherein:
each of the plurality of semiconductor chips includes a circuit provided at a center part of each of the plurality of semiconductor chips;
the draw-out electrode includes a plurality of first draw-out electrodes which is electrically connected to the circuit, and which is provided at an outside of the circuit in a first direction along a second direction crossing the first direction, and a plurality of second draw-out electrodes which is electrically connected to the circuit and provided at the outside of the circuit in the second direction along the first direction;
directions in each of which the plurality of second electrodes of one of the plurality of semiconductor chips are arranged side by side match with each other, in a case that the plurality of semiconductor chips is located at the designed position; and
the exposing of the determined pattern of the relay wiring to the photosensitive layer by the energy beam travelled via the pattern forming device includes:
performing a scan exposure of the energy beam along the first direction of the plurality of semiconductor chips; and
performing the scan exposure of the energy beam along the second direction of the plurality of semiconductor chips.

(Item 17)

An exposure system comprising:
a measurement section configured to measure a position of the plurality of semiconductor chips provided on a substrate;
a pattern determination section configured to obtain a positional deviation of the plurality of semiconductor chips from a designed position based on the measured position, and determine a pattern of a relay wiring relaying the plurality of semiconductor chips and an output wiring based on the positional deviation; and
a pattern exposure section configured to expose the determined pattern of the relay wiring onto the plurality of semiconductor chips by an energy beam travelled via a pattern forming device.

(Item 18)

The exposure system according to item 17, further comprising a mask exposure section configured to expose a pattern of the output wiring onto the relay wiring formed by using the exposed pattern of the relay wiring, by an exposure light travelled via a mask having a mask pattern of at least a portion of the output wiring.

(Item 19)

The exposure system according to item 17 or 18, wherein the pattern determination section includes:
- a memory unit configured to store a correspondence relationship between the plurality of kinds of the positional deviation and a plurality of wiring patterns; and
- a determination unit configured to determine the pattern of the relay wiring based on the positional deviation and the correspondence relationship.

(Item 20)

The exposure system according to item 17 or 18, wherein the pattern determination section includes:
- a memory unit configured to store a first correspondence relationship between the plurality of kinds of the positional deviation and a plurality of first wiring patterns and a second correspondence relationship between the plurality of kinds of the positional deviation and a plurality of second wiring patterns; and
- a determination unit configured to determine the pattern of the relay wiring based on the positional deviation, the first correspondence relationship, and the second correspondence relationship;
- a wiring length of each of the plurality of second wiring patterns is shorter than a wiring length of each of the plurality of first wiring patterns; and
- the determination unit is configured to determine the pattern of the relay wiring based on one of the plurality of first wiring patterns selected based on the positional deviation and the first correspondence relationship and one of the plurality of second wiring patterns selected based on the positional deviation and the second correspondence relationship.

(Item 21)

The exposure system according to any one of items 17 to 20, wherein the pattern exposure section includes the pattern determination section.

(Item 22)

The exposure apparatus for exposing a plurality of semiconductor chips provided on a substrate, the exposure apparatus comprising:
- a pattern determination unit configured to determine a pattern of a relay wiring connecting the plurality of semiconductor chips and an output wiring based on a positional deviation of the plurality of semiconductor chips from a designed position; and
- an exposure unit configured to expose the determined pattern of the relay wiring onto the plurality of semiconductor chips by an energy beam travelled via a pattern formation device set by using an output from the pattern determination unit.

(Item 23)

The exposure apparatus according to item 22, wherein the pattern determination unit includes:
- a memory unit configured to store a correspondence relationship between a plurality of kinds of the positional deviation and a plurality of wiring patterns; and
- a determination unit configured to determine the pattern of the relay wiring based on the positional deviation and the correspondence relationship.

(Item 24)

The exposure apparatus according to item 22 or 23, wherein the pattern determination unit includes:
- a memory unit configured to store a first correspondence relationship between a plurality of kinds of the positional deviation and a plurality of first wiring patterns and a second correspondence relationship between a plurality of kinds of the positional deviation and a plurality of second wiring patterns; and
- a determination unit configured to determine the pattern of the relay wiring based on the positional deviation, the first correspondence relationship, and the second correspondence relationship;
- a wiring length of each of the plurality of second wiring patterns is shorter than a wiring length of each of the plurality of first wiring patterns; and
- the determining unit is configured to determine the pattern of the relay wiring based on one of the plurality of first wiring patterns selected based on the positional deviation and the first correspondence relationship and one of the plurality of second wiring patterns selected based on the positional deviation and the second correspondence relationship.

(Item 25)

A device comprising:
- a substrate; and
- a plurality of semiconductor chips provided on the substrate; wherein
- each of the plurality of semiconductor chips includes a circuit provided at a center part of each of the plurality of semiconductor chips, and a plurality of electrodes which is electrically connected to the circuit and which is arranged at an outside of the circuit along a single direction; and
- the plurality of semiconductor chips is fixed to the wafer such that the single direction, of each of the plurality of semiconductor chips, in which the plurality of electrodes is arranged match or substantially match with each other.

(Item 26)

The device according to item 25 wherein the plurality of electrodes is provided only at the outside of the circuit.

(Item 27)

The device according to item 25 or 26, wherein at least two of the plurality of semiconductor chips is provided at a first section on the substrate, and at least two of the plurality of semiconductor chips different from the at least two of the plurality of semiconductor chips provided at the first section is provided at a second section different from the first section.

(Item 28)

The device according to item 27, wherein the at least two semiconductor chips are arranged side by side in the single direction in each of the first section and the second section.

(Item 29)

The device according to any one of items 25 to 28, further comprising a fixing layer configured to fix the plurality of semiconductor chips to the substrate, wherein a top surface of the fixing layer and a top surface of the plurality of semiconductor chips are flush with each other.

(Item 30)

The device according to any one of items 27 to 29 further comprising an output wiring layer provided above the plurality of semiconductor chips, wherein the output wiring layer has, in each of the sections, an output wiring connecting the at least two semiconductor chips.

(Item 31)

The device according to item 30 further comprising a relay wiring layer provided above the plurality of semiconductor chips and below the output wiring layer, wherein the relay wiring layer includes a relay wiring for each of the plurality of sections, the relay wiring electrically relaying the at least two semiconductor chips and the output wiring pattern.

REFERENCE SIGNS LIST

10: Semiconductor device
100: Measurement section
200: Pattern determination section
300: Pattern exposure section
320: Pattern generation device
400: Mask exposure section
CP1, CP2, CP3: Semiconductor chip
T: draw-out electrode
TA1: First electrode formation area
TA2: Second electrode formation area
W2: Relay wiring (relay wiring layer)
W4: Re-wiring (re-wiring layer)
W41: Output wiring (output wiring layer)
W42: Inter-chip wiring (inter-chip wiring layer)

The invention claimed is:

1. An exposure apparatus for exposing a photosensitive layer formed as an upper layer of a draw-out electrode provided on a plurality of semiconductor chips arranged on a substrate, the exposure apparatus comprising:
a substrate stage onto which the substrate is to be mounted, the plurality of semiconductor chips being arranged on the substrate along a uniaxial direction;
an exposure unit configured to radiate an exposure light toward the draw-out electrode provided in an electrode formation area extending, on at least one of the plurality of semiconductor chips, along the uniaxial direction;
a pattern determination unit configured to determine an exposure pattern to be exposed onto the photosensitive layer by the exposure unit; and
a controller configured to control at least the substrate stage and the exposure unit, wherein:
the pattern determination unit is configured to determine, as the exposure pattern, a pattern of a relay wiring connecting the draw-out electrode and a predetermined position with respect to the substrate, by using an output from a measurement unit configured to measure a position of the plurality of semiconductor chips provided on the substrate so as to obtain a positional deviation of the plurality of semiconductor chips; and
the controller is configured to expose the pattern of the relay wiring onto an exposure area extending, on the photosensitive layer, in the uniaxial direction by the exposure unit, while moving the substrate from a first-side in the uniaxial direction to a second-side opposite to the first-side in the uniaxial direction by the substrate stage.

2. The exposure apparatus according to claim 1, wherein the electrode formation area of each of at least two of the plurality of semiconductor chips overlaps with the exposure area extending in the uniaxial direction.

3. The exposure apparatus according to claim 1, wherein:
the exposure area is a first exposure area; and
the controller is configured to:
move the substrate on which the plurality of semiconductor chips is provided in a crossing direction crossing the uniaxial direction by using the substrate stage, after the exposing of the pattern of the relay wiring onto the first exposure area; and
exposing the pattern of the relay wiring onto a second exposure area by using the exposure unit, while moving the substrate from the second-side in the uniaxial direction to the first-side in the uniaxial direction by the substrate stage, the second exposure area being separated from the first exposure area in the crossing direction on the photosensitive layer.

4. The exposure apparatus according to claim 3 wherein the first exposure area and the second exposure area are not overlapped with a center part of each of the plurality of semiconductor chips.

5. The exposure apparatus according to claim 1, wherein the electrode formation area localizes separated from a center of corresponding one of the plurality of semiconductor chips in a crossing direction crossing the uniaxial direction.

6. The exposure apparatus according to claim 1, wherein the pattern determination unit includes:
a memory unit configured to store a correspondence relationship between a plurality of kinds of the positional deviation and a plurality of kinds of the pattern of the relay wiring; and
a determination unit configured to determine the pattern of the relay wiring based on an output from the measurement unit and the correspondence relationship.

7. The exposure apparatus according to claim 6, wherein:
the memory unit is configured to store the plurality of kinds of the pattern of the relay wiring; and
the determination unit is configured to select at least one pattern of the relay wiring from the plurality of kinds of the pattern of the relay wiring.

8. The exposure apparatus according to claim 6, wherein the pattern of the relay wiring includes a pattern of a first relay wiring extending from the draw-out electrode to a first position, and a pattern of a second relay wiring extending from the first position to a second position.

9. The exposure apparatus according to claim 8, wherein:
the memory unit is configured to store a plurality of kinds of the pattern of the first relay wiring and a plurality of kinds of the pattern of the second relay wiring; and
the determination unit is configured to select at least one pattern from the plurality of kinds of the pattern of the first relay wiring and at least one pattern from the plurality of kinds of the pattern of the second relay wiring such that the second position matches with the predetermined position.

10. The exposure apparatus according to claim 1, wherein:
the exposure unit includes a light pattern forming member configured to form a light pattern corresponding to a portion of the exposure pattern; and
the light pattern formed by the light pattern forming member changes as the substrate is moved in the uniaxial direction.

11. The exposure apparatus according to claim 1, wherein the pattern of the relay wiring is a pattern extending in one direction.

12. The exposure apparatus according to claim 1, wherein the measurement unit is configured to measure a substrate alignment mark provided on the substrate and a chip alignment mark provided on each of the plurality of semiconductor chips.

13. The exposure apparatus according to claim 1 comprising the measurement unit.

14. The exposure apparatus according to claim 13, wherein:
the measurement unit provided outside the exposure apparatus is a first measurement unit; and
the first measurement unit is configured to measure a substrate alignment mark provided on the substrate and a chip alignment mark provided on each of the plurality of semiconductor chips;
the exposure apparatus comprising a second measurement unit configured to measure the substrate alignment mark provided on the substrate.

15. The exposure apparatus according to claim 1 comprising a reception unit configured to receive an output from the measurement unit provided outside the exposure apparatus and transmit the received output to the pattern determination unit.

16. The exposure apparatus according to claim 1, wherein:
the exposure area is a first exposure area;
the controller is configured to expose the pattern of the relay wiring onto a second exposure area crossing the first exposure area on the photosensitive layer by the exposure unit, while moving the substrate on which the plurality of semiconductor chips is provided in a crossing direction crossing the uniaxial direction by using the substrate stage, after the exposing of the pattern of the relay wiring onto the first exposure area.

17. The exposure apparatus according to claim 16, wherein the first exposure area and the second exposure area do not overlap with a center part of each of the plurality of semiconductor chip.

18. The exposure apparatus according to claim 1, wherein the exposure unit includes variable pattern generation member configured to form, on the photosensitive layer, a light pattern corresponding to the exposure pattern determined by the pattern determination unit.

19. An exposure method for exposing a photosensitive layer formed as an upper layer of a draw-out electrode provided in a plurality of semiconductor chips arranged on a substrate, the method comprising performing an exposure to the photosensitive layer by using the exposure apparatus as defined in claim 1.

20. A device manufacturing method for manufacturing a device including a plurality of semiconductor chips having a draw-out electrode, a relay wiring having a first-end electrically connected to the draw-out electrode, and an output wiring electrically connected to a second-end, opposite to the first-end, of the relay wiring, the method comprising:
forming a photosensitive layer on the plurality of semiconductor chips;
exposing a pattern of the relay wiring onto the photosensitive layer by using the exposure method as defined in claim 19;
forming a pattern of the photosensitive layer by developing the photosensitive layer to which the exposing of the pattern of the relay wiring has been performed; and
forming the relay wiring by using the formed pattern of the photosensitive layer.

21. The device manufacturing method according to claim 20 comprising:
forming a second photosensitive layer on a relay wiring layer in which the relay wiring is formed; and
exposing at least a portion of a pattern of the output wiring onto the second photosensitive layer by an exposure light having travelled via a photomask having a mask pattern of at least a portion of the output-wiring.

22. A device comprising:
a substrate;
a plurality of semiconductor chips provided on the substrate;
the relay wiring layer formed on the plurality of semiconductor chips by using the device manufacturing method as defined in claim 21; and
the pattern of the output wiring formed on the relay wiring layer.

23. An exposure method for exposing a photosensitive layer formed as an upper layer of a draw-out electrode provided on a plurality of semiconductor chips arranged on a substrate along a uniaxial direction, the method comprising:
obtaining a positional deviation of the plurality of semiconductor chips by measuring a position of the plurality of semiconductor chips provided on the substrate;
radiating an exposure light toward the draw-out electrode provided in an electrode formation area extending along the uniaxial direction on the plurality of semiconductor chips;
determining, as the exposure pattern, a pattern of a relay wiring connecting the draw-out electrode and a predetermined position with respect to the substrate by using the obtained positional deviation of the plurality of semiconductor chips; and
exposing the pattern of the relay wiring onto an exposure area extending in the uniaxial direction on the photosensitive layer while moving the substrate from a first-side in the uniaxial direction to a second-side opposite to the first-side in the uniaxial direction.

24. The exposure method according to claim 23, wherein the exposure area is a first exposure area,
the method further comprising:
moving the substrate on which the plurality of semiconductor chips is provided in a crossing direction crossing the uniaxial direction, after the exposing of the pattern of the relay wiring onto the first exposure area,
exposing the pattern of the relay wiring onto a second exposure area separated from the first exposure area in the crossing direction on the photosensitive layer, while moving the substrate from the second-side to the first-side in the uniaxial direction.

25. The exposure method according to claim 24, wherein the first exposure area and the second exposure area do not overlap with a center part of each of the plurality of semiconductor chips.

26. The exposure method according to claim 23, wherein the measuring of the position of the plurality of semiconductor chips includes measuring a wafer alignment mark provided on the substrate and measuring a chip alignment mark provided on each of the plurality of semiconductor chips.

27. A device manufacturing method for manufacturing a device including a plurality of semiconductor chips having a draw-out electrode, a relay wiring having a first-end electrically connected to the draw-out electrode, and an output wiring electrically connected to a second-end, opposite to the first-end, of the relay wiring, the method comprising:
forming a photosensitive layer on the plurality of semiconductor chips;
exposing a pattern of the relay wiring onto the photosensitive layer by using the exposure method as defined in claim 20;

forming a pattern of the photosensitive layer by developing the photosensitive layer to which the exposing of the pattern of the relay wiring has been performed; and forming the relay wiring by using the formed pattern of the photosensitive layer.

28. The device manufacturing method according to claim 27 comprising:

forming a second photosensitive layer on a relay wiring layer in which the relay wiring is formed; and exposing at least a portion of a pattern of the output wiring onto the second photosensitive layer by an exposure light having travelled via a photomask having a mask pattern of at least a portion of the output-wiring.

29. A device comprising:

a substrate;

a plurality of semiconductor chips provided on the substrate;

the relay wiring layer formed on the plurality of semiconductor chips by using the device manufacturing method as defined in claim 28; and the pattern of the output wiring formed on the relay wiring layer.

* * * * *